United States Patent
Kim et al.

(10) Patent No.: US 12,426,312 B2
(45) Date of Patent: Sep. 23, 2025

(54) SEMICONDUCTOR DEVICE AND METHOD FOR FABRICATING THE SAME

(71) Applicant: Samsung Electronics Co., Ltd., Suwon-si (KR)

(72) Inventors: Tea Won Kim, Hwaseong-si (KR); Hyung Joon Kim, Yongin-si (KR); Yong-Suk Tak, Seoul (KR); Yu Rim Kim, Hwaseong-si (KR); Kong Soo Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 674 days.

(21) Appl. No.: 17/653,390

(22) Filed: Mar. 3, 2022

(65) Prior Publication Data
US 2023/0035916 A1    Feb. 2, 2023

(30) Foreign Application Priority Data

Jul. 27, 2021 (KR) .................. 10-2021-0098390

(51) Int. Cl.
H10D 30/67 (2025.01)

(52) U.S. Cl.
CPC ..... H10D 30/6755 (2025.01); H10D 30/6745 (2025.01)

(58) Field of Classification Search
CPC ..... H01L 29/7869; H01L 28/40; H01L 28/60; H01L 28/82; H01L 28/90–92; H01L 29/78672; H01L 29/78696; H10B 12/315; H10B 12/033; H10B 12/34; H10B 12/03; H10D 30/6755; H10D 1/716; H10D 30/6757
See application file for complete search history.

(56) References Cited

U.S. PATENT DOCUMENTS

| | | |
|---|---|---|
| 8,685,787 B2 | 4/2014 | Yamazaki |
| 8,779,420 B2 | 7/2014 | Yamazaki |
| 9,202,690 B2 | 12/2015 | Lee et al. |
| 9,722,049 B2 | 8/2017 | Lee et al. |

(Continued)

FOREIGN PATENT DOCUMENTS

| | | |
|---|---|---|
| JP | 2010040552 A | 2/2010 |
| JP | 6852996 B2 | 3/2021 |

*Primary Examiner* — Moazzam Hossain
(74) *Attorney, Agent, or Firm* — Wolf, Greenfield & Sacks, P.C.

(57) ABSTRACT

A semiconductor device includes a conductive line that extends in a first direction on a substrate, a first oxide semiconductor layer, including a first crystalline oxide semiconductor material containing a first metal element, on the conductive line, a second oxide semiconductor layer, which is in physical contact with the first oxide semiconductor layer and is connected to the conductive line, on the conductive line, a gate electrode that extends in a second direction, which crosses the first direction, on a side of the second oxide semiconductor layer, and a capacitor structure connected to the second oxide semiconductor layer on the second oxide semiconductor layer and the gate electrode, wherein the second oxide semiconductor layer includes a second crystalline oxide semiconductor material containing the first metal element and second and third metal elements, which are different from the first metal element.

13 Claims, 27 Drawing Sheets

(56) References Cited

U.S. PATENT DOCUMENTS

| | | |
|---|---|---|
| 10,347,771 B2 | 7/2019 | Yamazaki |
| 10,749,035 B2 | 8/2020 | Nakazumi et al. |
| 2011/0127521 A1* | 6/2011 | Yamazaki ............. H01L 29/045 156/60 |
| 2014/0175423 A1 | 6/2014 | Jeong et al. |
| 2017/0221899 A1* | 8/2017 | Uesugi ................ H10D 86/481 |
| 2017/0358582 A1* | 12/2017 | Zhou ....................... H10B 12/50 |
| 2023/0171937 A1* | 6/2023 | Doornbos ............ H10B 12/395 257/296 |

\* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2021-0098390 filed on Jul. 27, 2021 in the Korean Intellectual Property Office and all the benefits accruing therefrom under 35 U.S.C. 119, the contents of which in its entirety are herein incorporated by reference.

BACKGROUND

Technical Field

The present disclosure relates to a semiconductor device and a method for fabricating the same, and more particularly, to a semiconductor device including an oxide semiconductor material and a method for fabricating the same.

Description of the Related Art

As semiconductor devices have become more highly integrated, it may be important to control leakage current characteristics of the semiconductor device. To reduce a leakage current of a semiconductor device, a channel layer containing an oxide semiconductor material (e.g., indium gallium zinc oxide (IGZO)) has been studied. The oxide semiconductor material has an on-current similar to that of silicon (Si) and also has a high band gap energy, thereby having excellent leakage current characteristics.

The oxide semiconductor material may have various types of crystallinity depending on a deposition method or a post-treatment method, and may have various electrical characteristics and stability based on the crystallinity. In this respect, a technology capable of controlling crystallinity of the oxide semiconductor material has been required to efficiently configure a channel layer including an oxide semiconductor material for particular electrical design goals or requirements.

SUMMARY

Aspects of the present disclosure provide a semiconductor device having improved performance and reliability.

Aspects of the present disclosure also provide a method for fabricating a semiconductor device having improved performance and reliability.

The aspects of the present disclosure are not limited to those mentioned above and additional aspects of the present disclosure, which are not summarized herein, will be clearly understood by those skilled in the art from the following description.

According to an aspect of the present inventive concept, there is provided a semiconductor device comprising a conductive line that extends in a first direction on a substrate, a first oxide semiconductor layer, including a first crystalline oxide semiconductor material containing a first metal element, on the conductive line, a second oxide semiconductor layer, which is in physical contact with the first oxide semiconductor layer and is connected to the conductive line, on the conductive line, a gate electrode that extends in a second direction, which crosses the first direction, on a side of the second oxide semiconductor layer, and a capacitor structure connected to the second oxide semiconductor layer on the second oxide semiconductor layer and the gate electrode, wherein the second oxide semiconductor layer includes a second crystalline oxide semiconductor material containing the first metal element and second and third metal elements, which are different from the first metal element.

According to an aspect of the present inventive concept, there is provided a semiconductor device comprising a conductive line that extends in a first direction on a substrate, a lower oxide layer on a side of the conductive line and on the substrate, a first oxide semiconductor layer, including a first crystalline oxide semiconductor material containing a first metal element, on the conductive line, an isolation insulating layer including a channel trench, which extends in a second direction crossing the first direction, on the conductive line and the lower oxide layer, at least a portion of the lower oxide layer and at least a portion of the first oxide semiconductor layer being free of the isolation insulating layer in the channel trench, a second oxide semiconductor layer, which extends along at least a portion of the channel trench, and physically contacts the lower oxide layer and the first oxide semiconductor layer, the second oxide semiconductor layer being connected to the conductive line, a first gate electrode, which extends in the second direction inside the channel trench on the second oxide semiconductor layer, and a capacitor structure, which is connected to the second oxide semiconductor layer, on the isolation insulating layer, wherein the second oxide semiconductor layer includes a second crystalline oxide semiconductor material containing the first metal element and second and third metal elements, which are different from the first metal element.

According to an aspect of the present inventive concept, there is provided a semiconductor device comprising a substrate, a first oxide semiconductor layer, including a first crystalline oxide semiconductor material containing a first metal element, on the substrate, a second oxide semiconductor layer, including a second crystalline oxide semiconductor material containing the first metal element and second and third metal elements, which are different from the first metal element, on the first oxide semiconductor layer, and a gate electrode on the second oxide semiconductor layer, wherein a concentration reduction rate of the third metal element in the first oxide semiconductor layer is greater than a concentration reduction rate of the first metal element in the first oxide semiconductor layer in a direction away from the second oxide semiconductor layer.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

Figure 1:
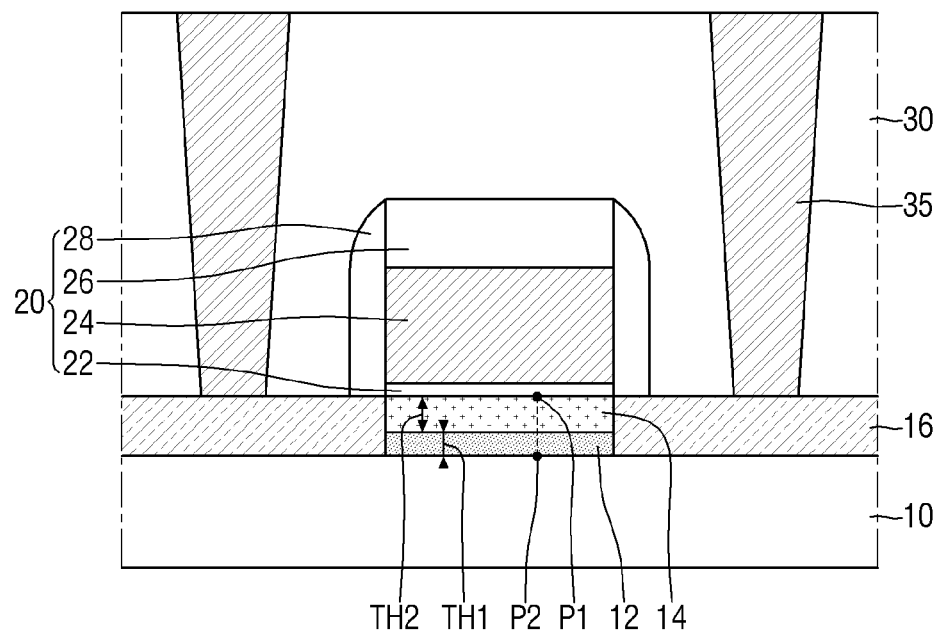
FIG. 1 is an example cross-sectional view illustrating a semiconductor device according to some embodiments.

Hereinafter, embodiments of the inventive concept will be described in detail with reference to the accompanying drawings. Identical reference numerals are used for the same constituent elements in the drawings, and duplicate descriptions thereof are omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
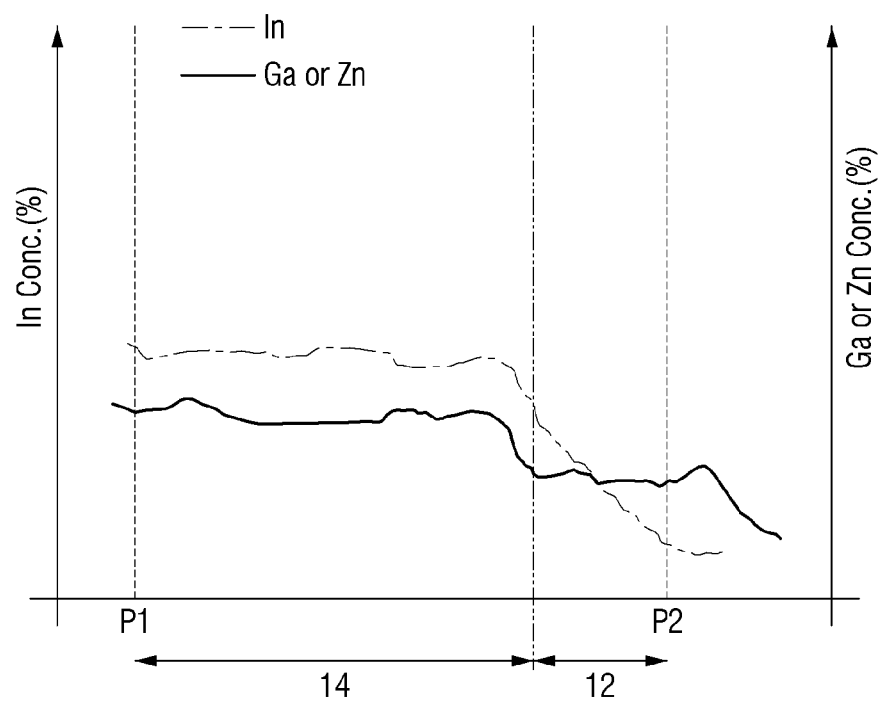
FIG. 2 is an example graph illustrating a first oxide semiconductor layer and a second oxide semiconductor layer of FIG. 1.

FIG. 1 is an example cross-sectional view illustrating a semiconductor device according to some embodiments. FIG. 2 is an example graph illustrating a first oxide semiconductor layer and a second oxide semiconductor layer of FIG. 1.

Although FIG. 1 shows only a planar FET including a planar channel area as an example of a semiconductor device according to some embodiments, it will be understood that embodiments of the inventive concept are not limited to this example. As another example, the semiconductor device, according to some embodiments, may include a fin-type transistor (fin FET), a tunneling transistor (tunneling FET), a transistor including a nanowire or a nanosheet, a vertical FET (VFET), a complementary FET (CFET), and/or a three-dimensional (3D) transistor. In other embodiments, the semiconductor device may include a bipolar junction transistor, a lateral double diffusion transistor (LDMOS), and the like.

Referring to FIGS. 1 and 2, a semiconductor device, according to some embodiments, includes a first substrate 10, a first oxide semiconductor layer 12, a second oxide semiconductor layer 14, a source/drain area 16, a gate structure 20, an interlayer insulating layer 30, and a source/drain contact 35.

The first substrate 10 may be a bulk silicon substrate or a silicon-on-insulator (SOI) substrate. Otherwise, the substrate 100 may be a silicon substrate, or may include other materials, such as silicon germanium, silicon germanium on insulator (SGOI), indium antimonide, lead telluride compound, indium arsenide, indium phosphide, gallium arsenide and/or gallium antimonide. Otherwise, the substrate 100 may be an epitaxial layer formed on a base substrate.

The first oxide semiconductor layer 12 may be formed on the first substrate 10. For example, the first oxide semiconductor layer 12 may extend along a portion of an upper surface of the first substrate 10. The first oxide semiconductor layer 12 may include a first crystalline oxide semiconductor material having crystallinity. For example, the first crystalline oxide semiconductor material may include a polycrystalline structure, a spinel crystal structure, and/or a c-axis aligned crystalline structure (CAAC).

In some embodiments, the first crystalline oxide semiconductor material may include a binary or ternary oxide semiconductor material containing a first metal element, or a ternary oxide semiconductor material containing first and second metal elements, which are different from each other. The binary or ternary oxide semiconductor material may be, but is not limited to, one of zinc oxide (ZnO, $Zn_xO$), gallium oxide (GaO, $Ga_xO$), tin oxide (TiO, $Ti_xO$), zinc oxynitride (ZnON, $Zn_xO_yN$), indium zinc oxide (IZO, $In_xZn_yO$), gallium zinc oxide (GZO, $Ga_xZn_yO$), tin zinc oxide (TZO, $Sn_xZn_yO$) and/or tin gallium oxide (TGO, $Sn_xGa_yO$).

The second oxide semiconductor layer 14 may be formed on the first oxide semiconductor layer 12. For example, the second oxide semiconductor layer 14 may extend along an upper surface of the first oxide semiconductor layer 12. The second oxide semiconductor layer 14 may be in physical contact with the first oxide semiconductor layer 12. As used herein, when an element is referred to as being "directly in contact" with another element, it indicates that there are no other elements interposed between them. The second oxide semiconductor layer 14 may include a second crystalline oxide semiconductor material having crystallinity. For example, the second crystalline oxide semiconductor material may include a polycrystalline structure, a spinel crystal structure, and/or a c-axis aligned crystalline structure (CAAC).

In some embodiments, the second crystalline oxide semiconductor material may include a quaternary oxide semiconductor material containing the first and second metal elements and a third metal element, which is different from the first and second metal elements. For example, the quaternary oxide semiconductor material may be, but is not limited to, one or more of indium gallium zinc oxide (IGZO, $In_xGa_yZn_zO$), indium gallium silicon oxide (IGSO, $In_xGa_ySi_zO$), indium tin zinc oxide (ITZO, $In_xSn_yZn_zO$), indium tin gallium oxide (ITGO, $In_xSn_yGa_zO$), zirconium zinc tin oxide (ZZTO, $Zr_xZn_ySn_zO$), hafnium indium zinc oxide (HIZO, $Hf_xIn_yZn_zO$), gallium zinc tin oxide (GZTO, $Ga_xZn_ySn_zO$), aluminum zinc tin oxide (AZTO, $Al_xZn_ySn_zO$) and ytterbium gallium zinc oxide (YGZO, $Yb_xGa_yZn_zO$).

For example, the first metal element may be gallium (Ga), the second metal element may be zinc (Zn), and the third metal element may be indium. In this case, the first crystalline oxide semiconductor material may include, for example, polycrystalline GZO and/or spinel GZO. The second crystalline oxide semiconductor material may include, for example, polycrystalline IGZO, spinel IGZO, and/or c-axis aligned crystalline (CAAC) IGZO.

As the second oxide semiconductor layer 14 is formed on the first oxide semiconductor layer 12, the second oxide semiconductor layer 14 may have generally high crystallinity. In this case, the crystallinity means a ratio of mass (or volume) of a crystalline portion to a total mass (or volume) of a material containing the crystalline portion. For example, the first oxide semiconductor layer 12 containing the first metal element (or first and second metal elements) may serve as a seed layer in a process of depositing the second oxide semiconductor layer 14 containing the first to third metal elements to improve crystallinity of the second oxide semiconductor layer 14. This will be described in more detail with reference to FIGS. 24 to 27.

Each of the first oxide semiconductor layer 12 and the second oxide semiconductor layer 14 may have a band gap energy greater than that of silicon. For example, each of the first oxide semiconductor layer 12 and the second oxide semiconductor layer 14 may have a band gap energy of about 1.5 eV to 5.6 eV. For example, each of the first oxide semiconductor layer 12 and the second oxide semiconductor layer 14 may have optimal channel performance when having a band gap energy of about 2.0 eV to 4.0 eV.

A thickness TH1 of the first oxide semiconductor layer 12 and a thickness TH2 of the second oxide semiconductor layer 14 may be, for example, about 0.1 nm to about 50 nm, respectively. In some embodiments, the thickness TH1 of the first oxide semiconductor layer 12 and the thickness TH2 of the second oxide semiconductor layer 14 may be about 0.1 nm to about 10 nm, respectively. In some embodiments, the thickness TH2 of the second oxide semiconductor layer 14 may be greater than the thickness TH1 of the first oxide semiconductor layer 12. For example, the thickness TH1 of the first oxide semiconductor layer 12 may be about 0.1 nm to about 10 nm, and the thickness TH2 of the second oxide semiconductor layer 14 may be greater than the thickness of 0.1 nm to 10 nm.

Although a width of the first oxide semiconductor layer 12 and a width of the second oxide semiconductor layer 14 are shown to be the same as each other, this is only an example. In other embodiments, the width of the second oxide semiconductor layer 14 may be greater than or equal to the width of the first oxide semiconductor layer 12.

A concentration of the third metal element in the first oxide semiconductor layer 12 may be reduced with increasing distance of the third metal element from the second oxide semiconductor layer 14. For example, as shown in FIG. 2, the concentration of the third metal element (e.g., indium (In)) in the first oxide semiconductor layer 12 may be reduced with increasing distance of the third metal element from the second oxide semiconductor layer 14. This may be because that the third metal element of the second oxide semiconductor layer 14 is diffused into the first oxide semiconductor layer 12. For reference, FIG. 2 illustrates schematic concentrations of gallium (Ga) or zinc (Zn), and indium (In) in a scan line for connecting one point P1 on an upper surface of the second oxide semiconductor layer 14 with one point P2 on a lower surface of the first oxide semiconductor layer 12.

In a direction away from the second oxide semiconductor layer 14, a concentration reduction rate of the third metal element (e.g., indium (In)) in the first oxide semiconductor layer 12 may be greater than that of the first or second metal element (e.g., gallium (Ga) or zinc (Zn)) in the first oxide semiconductor layer 12. For example, the concentration of the first or second metal element (e.g., gallium (Ga) or zinc (Zn)) in the first oxide semiconductor layer 12 may be maintained to be substantially uniform in a direction away from the second oxide semiconductor layer 14.

In FIG. 2, although the concentration of the third metal element (e.g., indium (In)) in the second oxide semiconductor layer 14 is shown only to be greater than that of the first or second metal element (e.g., gallium (Ga) or zinc (Zn)) in the second oxide semiconductor layer 14, this is only an example. Also, although the concentration of the first or second metal element (e.g., gallium (Ga) or zinc (Zn)) in the first oxide semiconductor layer 12 is shown only to be less than that of the first or second metal element (e.g., gallium (Ga) or zinc (Zn)) in the second oxide semiconductor layer 14, this is also an example.

The gate structure 20 may be formed on the second oxide semiconductor layer 14. For example, the gate structure 20 may extend along the upper surface of the second oxide semiconductor layer 14. In some embodiments, the gate structure 20 may include a first gate dielectric layer 22, a first gate electrode 24, a first gate capping pattern 26, and a gate spacer 28.

The first gate dielectric layer 22 may be deposited on the second oxide semiconductor layer 14. The first gate dielectric layer 22 may be interposed between the second oxide semiconductor layer 14 and the first gate electrode 24. The first gate dielectric layer 22 may include, for example, a silicon oxide, a silicon oxynitride, a silicon nitride, and/or a high dielectric constant (high-k) material having a dielectric constant greater than that of the silicon oxide. The high-k material may include, but is not limited to, a hafnium oxide.

The first gate electrode 24 may be deposited on the first gate dielectric layer 22. The first gate electrode 24 may include a conductive material, for example, Ti, Ta, W, Al, Co, or combinations thereof, but embodiments are not limited thereto. The first gate electrode 24 may include, for example, silicon and/or silicon germanium, which is not metal.

Although the first gate electrode 24 is shown as a single layer, the embodiments of the inventive concept are not limited thereto. In other embodiments, the first gate electrode 24 may be formed by depositing a plurality of conductive materials. For example, the first gate electrode 24 may include a work function control layer for adjusting a work function and a filling conductive layer for filling a space formed by the work function control layer. The work function control layer may include, for example, TiN, TaN, TiC, TaC, TiAlC or combinations thereof. The filling conductive layer may include, for example, W and/or Al. In some embodiments, the first gate electrode 24 may be formed through a replacement process, but embodiments are not limited thereto.

The first gate capping pattern 26 may be on and at least partially cover an upper surface of the first gate electrode 24. The first gate capping pattern 26 may include, but is not limited to, silicon oxide, silicon nitride, silicon oxynitride, or combinations thereof.

Although a width of the first gate dielectric layer 22, a width of the first gate electrode 24, and a width of the first gate capping pattern 26 are shown as being the same as the width of the first oxide semiconductor layer 12 and/or the width of the second oxide semiconductor layer 14, this is only an example. As another example, the width of the first gate dielectric layer 22, the width of the first gate electrode 24, and the width of the first gate capping pattern 26 may be greater than or smaller than the width of the first oxide semiconductor layer 12 and/or the width of the second oxide semiconductor layer 14.

The gate spacer 28 may be on and at least partially cover a side of the first gate electrode 24. For example, the gate spacer 28 may extend along a side of the first gate dielectric layer 22, the side of the first gate electrode 24, and a side of the first gate capping pattern 26. The gate spacer 28 may include, but is not limited to, a silicon oxide, a silicon nitride, a silicon oxynitride, or combinations thereof.

The source/drain area 16 may be formed on the first substrate 10 on the side of the first gate electrode 24. Also, the source/drain area 16 may be connected to the second oxide semiconductor layer 14. For example, the source/drain area 16 may be formed on a side of the first oxide semiconductor layer 12 and a side of the second oxide semiconductor layer 14. Therefore, the second oxide semiconductor layer 14 may serve as a channel layer of a transistor that includes the first gate electrode 24. In some embodiments, the source/drain area 16 may include an epitaxial layer formed on the first substrate 10.

When the semiconductor device according to some embodiments is a PFET, the source/drain area 16 may include p-type impurities or impurities for reducing or preventing diffusion of the p-type impurities. For example, the source/drain area 16 may include B, C, In, Ga, and Al, or combinations thereof. When the semiconductor device according to some embodiments is an NFET, the source/drain area 16 may include n-type impurities or impurities for reducing or preventing diffusion of n-type impurities. For example, the source/drain area 16 may include P, Sb, As, or combinations thereof.

The interlayer insulating layer 30 may be on and at least partially cover the source/drain area 16 and the gate structure 20. The interlayer insulating layer 30 may include, for example, a silicon oxide, a silicon nitride, a silicon oxynitride, and/or a low-k material having a dielectric constant less than that of the silicon oxide. The low-k material may include, but is not limited to, Flowable Oxide (FOX), Torene SilaZene (TOSZ), Undoped Silica Glass (USG), Borosilica Glass (BSG), PhosphoSilica Glass (PSG), BoroPhospho-Silica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SILK, polyimide, a porous polymeric material or combinations thereof.

The source/drain contact 35 may be connected to the source/drain area 16. For example, the source/drain contact 35 may be connected to the source/drain area 16 by passing through the interlayer insulating layer 30. The source/drain contact 35 may include, but is not limited to, a conductive material, for example, a metal, a conductive metal nitride, a conductive metal carbonitride, a conductive metal carbide, a metal silicide, a doped semiconductor material, a conductive metal oxynitride, a conductive metal oxide, and/or a two-dimensional (2D) material.

To reduce a leakage current of the semiconductor device, a channel layer containing an oxide semiconductor material (e.g., IGZO) has been studied. The oxide semiconductor material may have an on-current similar to that of silicon (Si) and also may have a high band gap energy, thereby having excellent leakage current characteristics. However, the oxide semiconductor material with low crystallinity may be responsible for degrading the electrical characteristics and stability of the semiconductor device. For example, in the process of depositing a quaternary oxide semiconductor material (e.g., IGZO), a plurality of grain boundaries may be developed, which may result in the quaternary oxide semiconductor material having a relatively low degree of crystallinity. In addition, it may be difficult to generate a crystallinity at a specific thickness (e.g., several nm or less) in due to an amorphous area that is developed at an initial step of deposition in such a quaternary oxide semiconductor material (e.g., IGZO).

However, in a semiconductor device according to some embodiments, the second oxide semiconductor layer 14 may be formed on the first oxide semiconductor layer 12 to have a high degree of crystallinity. In detail, as described above, the first oxide semiconductor layer 12 containing the first metal element (or first and second metal elements) may serve as a seed layer in the process of depositing the second oxide semiconductor layer 14 containing the first to third metal elements, thereby improving crystallinity of the second oxide semiconductor layer 14. Therefore, a semiconductor device with improved performance and reliability may be provided.

Figure 3:
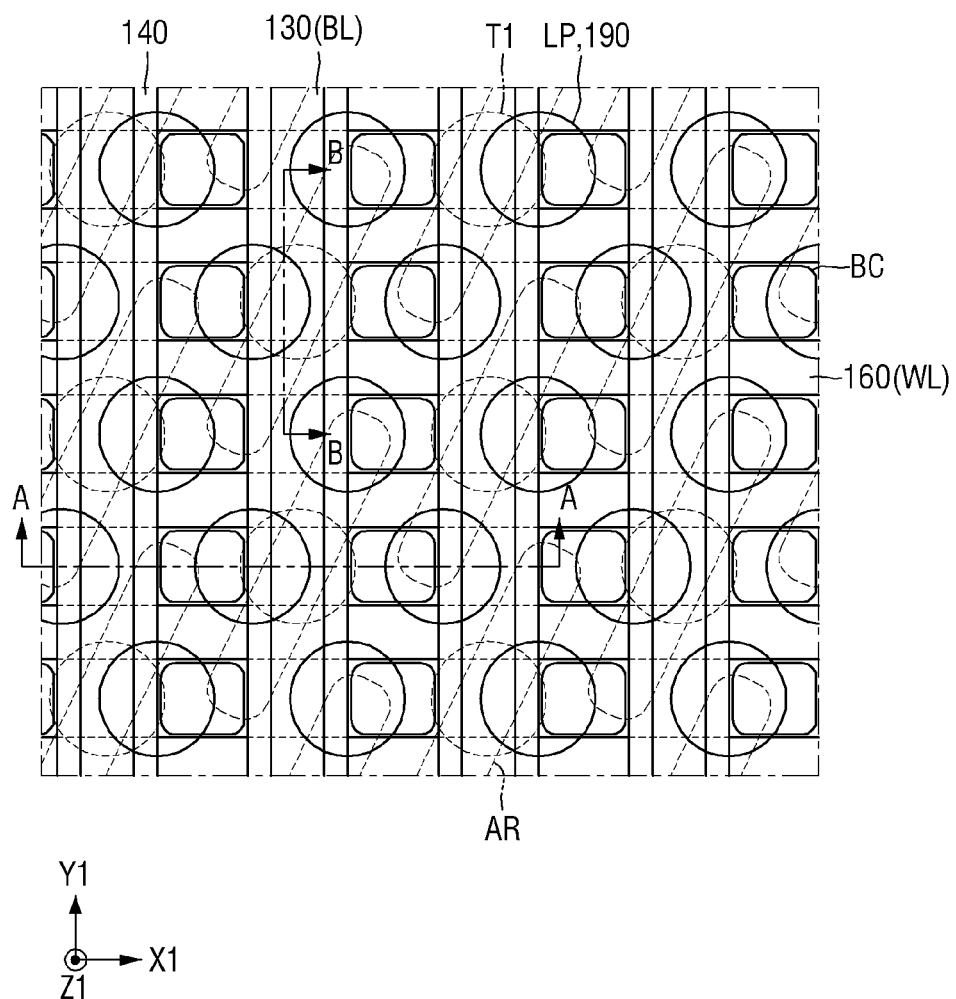
FIG. 3 is an example layout view illustrating a semiconductor device according to some embodiments.
Figure 4:
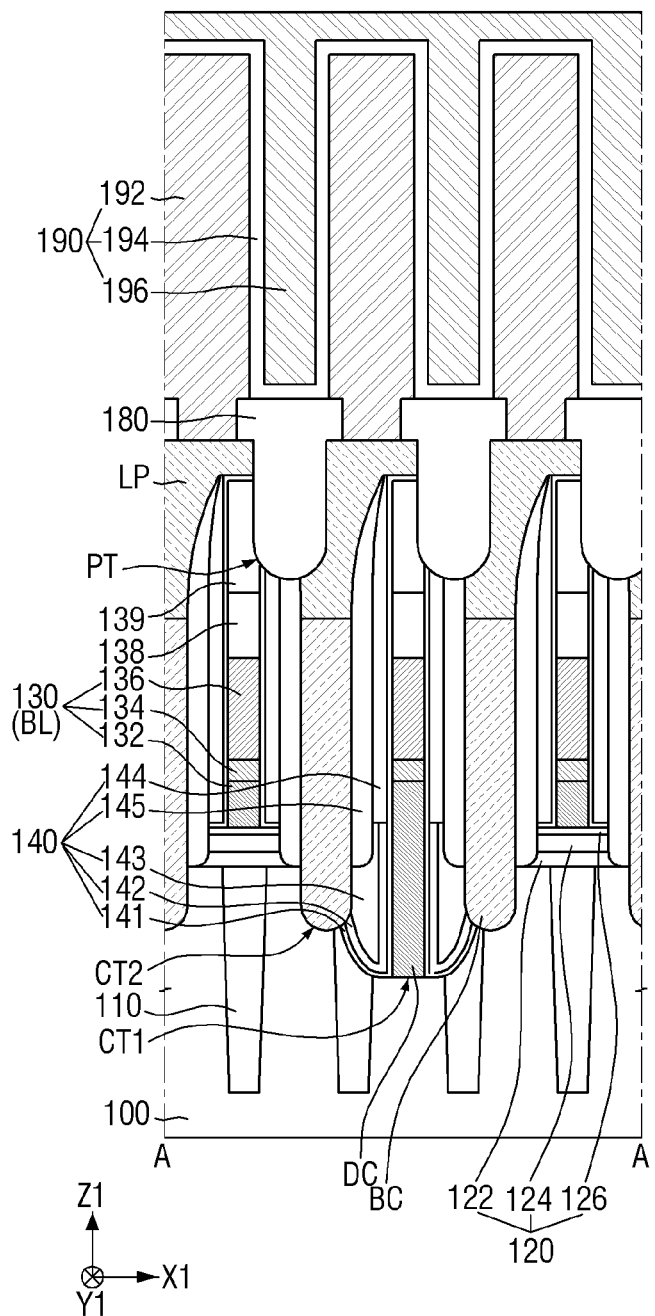
FIG. 4 is a cross-sectional view taken along line A-A of FIG. 3.
Figure 5:
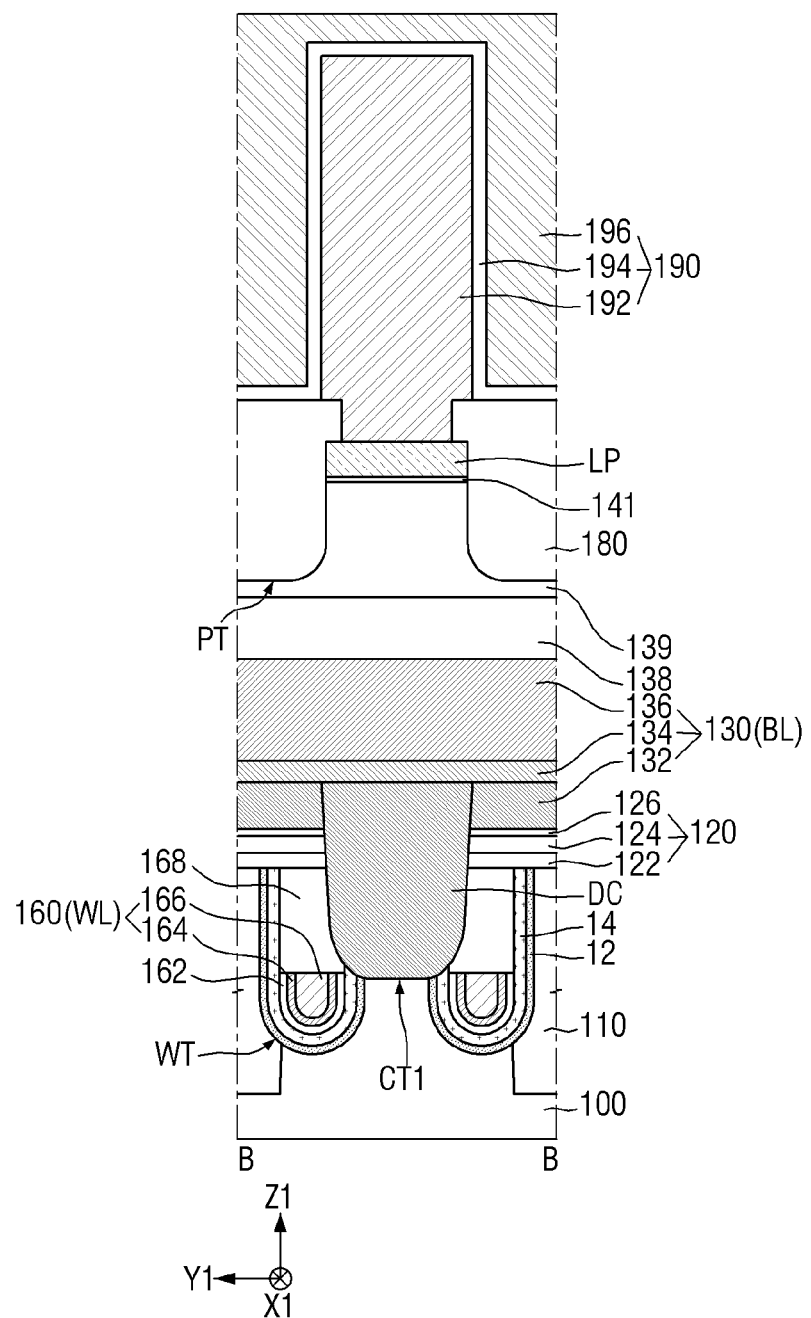
FIG. 5 is a cross-sectional view taken along line B-B of FIG. 3.

FIG. 3 is an example layout view illustrating a semiconductor device according to some embodiments. FIG. 4 is a cross-sectional view taken along line A-A of FIG. 3. FIG. 5 is a cross-sectional view taken along line B-B of FIG. 3. For convenience of description, portions duplicated with those described with reference to FIGS. 1 and 2 will be described briefly or omitted.

Referring to FIGS. 3 to 5, a semiconductor device according to some embodiments may include a second substrate 100, an element isolation layer 110, a base insulating layer 120, a first conductive line 130 (BL), a direct contact DC, a spacer structure 140, a first oxide semiconductor layer 12, a second oxide semiconductor layer 14, a second gate electrode 160 (WL), a second gate dielectric layer 162, contact structures BC and LP, and a first capacitor structure 190.

The second substrate 100 may be a structure in which a base substrate and an epitaxial layer are deposited, but embodiments are not limited thereto. The second substrate 100 may be a silicon substrate, a gallium arsenide substrate, a silicon germanium substrate, and/or a semiconductor-on-insulator (SOI) substrate. The following description will be based on the second substrate 100 being a silicon substrate by way of example.

The second substrate 100 may include an active area AR. The active area AR may be in the form of a plurality of bars extended to be parallel with each other. Also, the center of one of the plurality of active areas AR may be disposed to be adjacent to a distal end of the other active area AR. In some embodiments, the active area AR may be formed in the shape of a diagonal bar. For example, as shown in FIG. 3, the active area AR may be in the form of a bar extended in a third direction different from a first direction Y1 and a second direction X1 on a plane where the first direction Y1 and the second direction X1 are extended. An acute angle between the second direction X1 and the third direction may be, for example, 60°, but embodiments are not limited thereto.

The active area AR may include impurities and thus serve as a source/drain area. In some embodiments, a first portion (e.g., central portion) of the active area AR may be connected to the first conductive line 130 by the direct contact DC, and a second portion (e.g., both ends) of the active area AR may be connected to the first capacitor structure 190 by the contact structures BC and LP.

Figure 7:
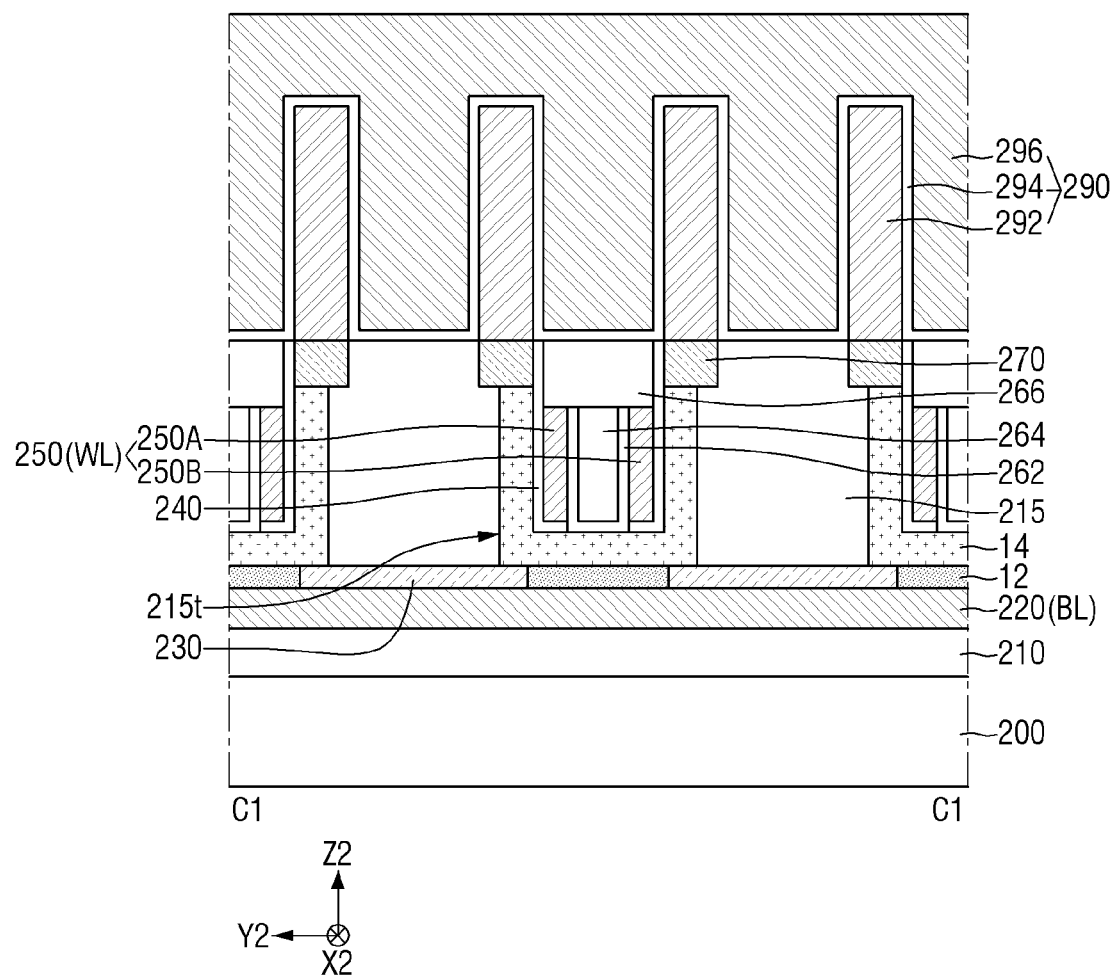
FIG. 7 is a cross-sectional view taken along the line C1-C1 of FIG. 6.

The element isolation layer 110 may define the plurality of active areas AR. Although FIGS. 5 and 7 show that a side of the element isolation layer 110 has an inclination, this is only a feature of a process, and embodiments are not limited thereto.

The element isolation layer 110 may include, but is not limited to, a silicon oxide, a silicon nitride, and/or a silicon oxynitride. The element isolation layer 110 may be a single layer made of one type of insulating material, or may be a multi-layer made of a combination of various types of insulating materials.

The base insulating layer 120 may be formed on the second substrate 100 and the element isolation layer 110. In some embodiments, the base insulating layer 120 may extend along an upper surface of the second substrate 100 and an upper surface of the element isolation layer 110 in an area where the contact structures BC and LP are not formed.

The base insulating layer 120 may be a single layer structure, but, in other embodiments, may be a multi-layer structure as shown. For example, the base insulating layer 120 may include a first insulating layer 122, a second insulating layer 124, and a third insulating layer 126, which are sequentially deposited on the second substrate 100. The first insulating layer 122 may include, for example, a silicon oxide. The second insulating layer 124 may include a material having an etching selection ratio different from that of the first insulating layer 122. For example, the second insulating layer 124 may include a silicon nitride. The third insulating layer 126 may include a material having a dielectric constant less than that of the second insulating layer 124. For example, the third insulating layer 126 may include a silicon oxide.

The first conductive line 130 may be formed on the second substrate 100, the element isolation layer 110, and the base insulating layer 120. The first conductive line 130 may longitudinally extend in the first direction Y1 across the active area AR and the second gate electrode 160. For example, the first conductive line 130 may obliquely cross the active area AR, and may vertically cross the second gate electrode 160. A plurality of first conductive lines 130 may be spaced apart from each other and arranged at generally constant intervals along the second direction X1. Each of the first conductive lines 130 may be connected to the active area AR and thus serve as a bit line BL of the semiconductor device according to some embodiments.

In some embodiments, the first conductive line 130 may include a first sub-conductive pattern 132, a second sub-conductive pattern 134, and a third sub-conductive pattern 136, which are sequentially deposited on the second substrate 100. Each of the first sub-conductive pattern 132, the second sub-conductive pattern 134 and the third sub-conductive pattern 136 may include, for example, polysilicon, TiN, TiSiN, tungsten, tungsten silicide, or combinations thereof, but embodiments are not limited thereto. For example, the first sub-conductive pattern 132 may include polysilicon, the second sub-conductive pattern 134 may include TiSiN, and the third sub-conductive pattern 136 may include tungsten.

In some embodiments, a first bit line capping pattern 138 and a second bit line capping pattern 139 may sequentially be formed on the first conductive line 130. The first bit line capping pattern 138 and the second bit line capping pattern 139 may extend along an upper surface of the first conductive line 130. The first bit line capping pattern 138 and the second bit line capping pattern 139 may include, but are not limited to, a silicon nitride.

The direct contact DC may be formed on the second substrate 100 and the element isolation layer 110. The direct contact DC may connect the active area AR of the second substrate 100 to the first conductive line 130 by passing through the base insulating layer 120. For example, the second substrate 100 may include a first contact trench CT1. The first contact trench CT1 may expose the first portion (e.g., central portion) of the active area AR by passing through the base insulating layer 120. The direct contact DC may be formed in the first contact trench CT1 to connect the first portion of the active area AR to the first conductive line 130.

In some embodiments, a portion of the first contact trench CT1 may overlap a portion of the element isolation layer 110. Therefore, the first contact trench CT1 may expose a portion of the element isolation layer 110 as well as a portion of the active area AR.

In some embodiments, a width of the direct contact DC may be less than that of the first contact trench CT1. For example, the direct contact DC may be in contact with only a portion of the second substrate 100, which is exposed by the first contact trench CT1. In some embodiments, a width of the first conductive line 130 may also be smaller than that of the first contact trench CT1. For example, the width of the first conductive line 130 may be the same as that of the direct contact DC.

The direct contact DC may include a conductive material. Therefore, the first conductive line 130 may be electrically connected to the active area AR of the second substrate 100. The first portion (e.g., central portion) of the active area AR, which is connected to the direct contact DC, may serve as the first source/drain area of the semiconductor device that includes the second gate electrode 160.

In some embodiments, the direct contact DC may include the same material as that of the first sub-conductive pattern 132. For example, the direct contact DC may include polysilicon, but this is only an example. The direct contact DC may include a material, which is different from that of the first sub-conductive pattern 132, depending on a fabricating process.

The spacer structure 140 may be formed on a side of the first conductive line 130. The spacer structure 140 may extend along the side of the first conductive line 130. For example, the spacer structure 140 may longitudinally extend in the first direction Y1. In some embodiments, the spacer structure 140 may include a first spacer 141, a second spacer 142, a third spacer 143, a fourth spacer 144, and a fifth spacer 145.

The first spacer 141 may extend along the side of the first conductive line 130. For example, the first spacer 141 may extend along sides of the first conductive line 130, the first bit line capping pattern 138, and the second bit line capping pattern 139. In the area where the first contact trench CT1 is formed, the first spacer 141 may extend along the side of the first conductive line 130, a side of the direct contact DC, and the first contact trench CT1. In some embodiments, the first spacer 141 may be in physical contact with the first conductive line 130 and the direct contact DC. In an area where the first contact trench CT1 is not formed, the first spacer 141 may extend along the side of the first conductive line 130 and an upper surface of the base insulating layer 120.

The second spacer 142 may be formed on the first spacer 141 in the first contact trench CT1. For example, the second spacer 142 may extend along a profile of the first spacer 141 in the first contact trench CT1.

The third spacer 143 may be formed on the second spacer 142 in the first contact trench CT1. The third spacer 143 may at least partially fill an area of the first contact trench CT1, which remains after the first spacer 141 and the second spacer 142 are formed.

The fourth spacer 144 may be formed on the second spacer 142 and the third spacer 143. The fourth spacer 144 may extend along at least a portion of the side of the first conductive line 130. For example, the fourth spacer 144 may extend along a side of the first spacer 141, in which the second spacer 142 is not formed.

The fifth spacer 145 may be formed on the third spacer 143. The fifth spacer 145 may extend along at least a portion of the side of the first conductive line 130. For example, the fifth spacer 145 may extend along a side of the fourth spacer 144. In some embodiments, a lower surface of the fifth spacer 145 may be formed to be lower than that of the fourth spacer 144. For example, a lower portion of the fifth spacer 145 may be embedded in the third spacer 143.

Each of the first spacer 141, the second spacer 142, the third spacer 143, the fourth spacer 144 and the fifth spacer 145 may include a silicon oxide, a silicon oxynitride, a silicon nitride, or combinations thereof. For example, the first spacer 141 may include a silicon nitride, the second spacer 142 may include a silicon oxide, the third spacer 143 may include a silicon nitride, the fourth spacer 144 may include a silicon oxide, and the fifth spacer 145 may include a silicon nitride.

In some embodiments, the spacer structure 140 may include an air spacer 140A. The air spacer 140A may be formed of air or void. Because the air spacer 140A has a dielectric constant less than that of the silicon oxide, parasitic capacitance of the semiconductor device according to some embodiments may be reduced effectively. For example, the fourth spacer 144 may be the air spacer.

The second gate electrode 160 may be formed on the second substrate 100 and the isolation layer 110. The second gate electrode 160 may longitudinally extend in the second direction X1 across the active area AR and the first conductive line 130. For example, the second gate electrode 160 may obliquely cross the active area AR, and may vertically cross the first conductive line 130. A plurality of second gate electrodes 160 may be spaced apart from each other and arranged at generally constant intervals along the first direction Y1. Each of the second gate electrodes 160 may be interposed between the direct contact DC and a buried contact BC to serve as a word line WL of the semiconductor device according to some embodiments.

In some embodiments, the second gate electrode 160 may include a fourth sub-conductive pattern 164 and a fifth sub-conductive pattern 166, which are sequentially deposited on the second substrate 100. Each of the fourth sub-conductive pattern 164 and the fifth sub-conductive pattern 166 may include, but is not limited to, metal, polysilicon, or combinations thereof.

The second gate dielectric layer 162 may be interposed between the second substrate 100 and the second gate electrode 160. The second gate dielectric layer 162 may include, but is not limited to, for example, a silicon oxide, a silicon oxynitride, a silicon nitride, and/or a high dielectric constant (high-k) material having a dielectric constant greater than that of the silicon oxide.

In some embodiments, the second gate capping pattern 168 may be formed on the second gate electrode 160. The second gate capping pattern 168 may include, but is not limited to, a silicon nitride.

The first oxide semiconductor layer 12 and the second oxide semiconductor layer 14 may be sequentially deposited on the second substrate 100 and the element isolation layer 110. The second gate dielectric layer 162 and the second gate electrode 160 may be sequentially deposited on the second oxide semiconductor layer 14. Therefore, the second oxide semiconductor layer 14 may serve as a channel layer of a transistor that includes the second gate electrode 160.

The semiconductor device according to some embodiments may be a semiconductor memory device that includes a buried channel transistor (BCAT). The buried channel transistor may refer to a structure in which a gate electrode (e.g., second gate electrode 160) is embedded in the second substrate 100. For example, the second substrate 100 may include a gate trench WT that extends in the second direction X1. In some embodiments, the gate trench WT may be formed in the second substrate 100 and the element isolation layer 110. The first oxide semiconductor layer 12 and the second oxide semiconductor layer 14 may extend to be conformal along a profile of the gate trench WT. The second gate dielectric layer 162 and the second gate electrode 160 may at least partially fill a portion of the gate trench WT on the second oxide semiconductor layer 14. The second gate capping pattern 168 may at least partially fill another portion of the gate trench WT on the second oxide semiconductor layer 14. In these embodiments, an upper surface of the second gate electrode 160 may be lower than that of the second substrate 100.

Although the uppermost surface of the first oxide semiconductor layer 12 and the uppermost surface of the second oxide semiconductor layer 14 are shown as being disposed on the upper surface and a coplanar surface of the second substrate 100, this is only an example. As another example, the first oxide semiconductor layer 12 and the second oxide semiconductor layer 14 may extend to be conformal along a profile of a portion of the gate trench WT.

The contact structures BC and LP may be formed on the second substrate 100 and the element isolation layer 110. The contact structures BC and LP may connect the active area AR of the second substrate 100 to the first capacitor structure 190 by passing through the base insulating layer 120. In some embodiments, the contact structures BC and LP may include a buried contact BC and a landing pad LP.

The buried contact BC may connect the active area AR of the second substrate 100 with the landing pad LP by passing through the base insulating layer 120. For example, the second substrate 100 may include a second contact trench CT2. The second contact trench CT2 may expose the second portion (e.g., both ends) of the active area AR by passing through the base insulating layer 120. The buried contact BC may be formed in the second contact trench CT2 to connect the second portion of the active area AR to the landing pad LP.

In some embodiments, a portion of the second contact trench CT2 may overlap a portion of the element isolation layer 110. Therefore, the second contact trench CT2 may expose a portion of the element isolation layer 110 as well as a portion of the active area AR.

The buried contact BC may be formed on a side of the spacer structure 140. The buried contact BC may be spaced apart from the first conductive line 130 by the spacer structure 140. In some embodiments, an upper surface of the buried contact BC may be lower than that of the second bit line capping pattern 139.

The buried contact BC may form a plurality of isolation areas spaced apart from each other. For example, as shown in FIG. 3, the plurality of buried contacts BC may be interposed between the plurality of first conductive lines 130 and between the plurality of second gate electrodes 160. In some embodiments, the plurality of buried contacts BC may be arranged in the form of a matrix.

The buried contact BC may include a conductive material. Therefore, the buried contact BC may be electrically connected to the active area AR of the second substrate 100. The second portion (e.g., both ends) of the active area AR, which is connected to the buried contact BC, may serve as a second source/drain area of the semiconductor device that includes the second gate electrode 160. The buried contact BC may include, for example, polysilicon, but embodiments are not limited thereto.

The landing pad LP may be formed on the buried contact BC. The landing pad LP may be disposed to overlap the buried contact BC. In this case, the overlap means overlap in a first vertical direction Z1 perpendicular to the upper surface of the second substrate 100. The landing pad LP may be connected to the upper surface of the buried contact BC to connect the active area AR to the first capacitor structure 190.

In some embodiments, the landing pad LP may be disposed to overlap a portion of the buried contact BC and a portion of the first conductive line 130. For example, the landing pad LP may overlap a portion of the buried contact BC and a portion of the second bit line capping pattern 139. In some embodiments, an upper surface of the landing pad LP may be higher than an upper surface of the second bit line capping pattern 139. In this case, the landing pad LP may at least partially cover a portion of the upper surface of the second bit line capping pattern 139.

The landing pad LP may form a plurality of isolation areas spaced apart from each other. For example, as shown in FIG. 3, a pad trench PT for defining a plurality of landing pads LP may be formed. In some embodiments, a portion of the pad trench PT may expose a portion of the second bit line capping pattern 139. For example, a lower surface of the pad trench PT may be lower than the upper surface of the second bit line capping pattern 139. In this case, the plurality of landing pads LP may be separated from each other by the second bit line capping pattern 139 and the pad trench PT. In some embodiments, the plurality of landing pads LP may be arranged in the form of a honeycomb.

The landing pad LP may include a conductive material. Therefore, the landing pad LP may be electrically connected to the buried contact BC. The landing pad LP may include, but is not limited to, tungsten (W).

In some embodiments, a first upper insulating layer 180 may be formed to at least partially fill the pad trench PT. The first upper insulating layer 180 may be formed on the landing pad LP and the second bit line capping pattern 139. Therefore, the first upper insulating layer 180 may define the landing pads LP for forming a plurality of isolation areas.

The first upper insulating layer 180 may include an insulating material. Therefore, the plurality of landing pads LP may be electrically separated from each other. The first upper insulating layer 180 may include, for example, a silicon oxide, a silicon nitride, a silicon oxynitride, and/or a low-k material having a dielectric constant smaller than that of the silicon oxide, but is not limited thereto.

The first capacitor structure 190 may be disposed on the first upper insulating layer 180 and the contact structures BC and LP. The first capacitor structure 190 may be connected to the upper surfaces of the contact structures BC and LP. For example, the first upper insulating layer 180 may be patterned to expose at least a portion of the upper surface of the landing pad LP. The first capacitor structure 190 may be connected to a portion of the upper surface of the landing pad LP, which is exposed by the first upper insulating layer 180. Therefore, the first capacitor structure 190 may be electrically connected to the second portion (e.g., both ends) of the active area AR through the contact structures BC and LP. The first capacitor structure 190 may be controlled by using the first conductive line 130 and the second gate electrode 160 to store data.

The first capacitor structure 190 may include a first lower electrode 192, a first capacitor dielectric layer 194, and a first upper electrode 196. The first capacitor structure 190 may store charges in the first capacitor dielectric layer 194 by using a potential difference generated between the first lower electrode 192 and the first upper electrode 196.

The first lower electrode 192 may be connected to the contact structures BC and LP. For example, the first lower electrode 192 may be connected to a portion of the upper surface of the landing pad LP, which is exposed by the first upper insulating layer 180. In FIGS. 4 and 5, the first lower electrode 192 is shown only in the form of a pillar that extends from the upper surface of the landing pad LP in the first vertical direction Z1, but this is only an example. As another example, the first lower electrode 192 may be in the form of a cylinder that extends from the upper surface of the landing pad LP in the first vertical direction Z1. In some embodiments, the plurality of first lower electrodes 192 may be arranged in the form of a honeycomb.

The first capacitor dielectric layer 194 may be formed on the first lower electrode 192. In some embodiments, the first capacitor dielectric layer 194 may extend to be conformal along a side and an upper surface of the first lower electrode 192 and a profile of an upper surface of the first upper insulating layer 180.

The first upper electrode 196 may be formed on the first capacitor dielectric layer 194. Although FIGS. 4 and 5 show that the first upper electrode 196 at least partially fills an area between the first lower electrodes 192 adjacent to each other, this is only an example. As another example, the first upper electrode 196 may extend to be conformal along a profile of the first capacitor dielectric layer 194.

Figure 6:
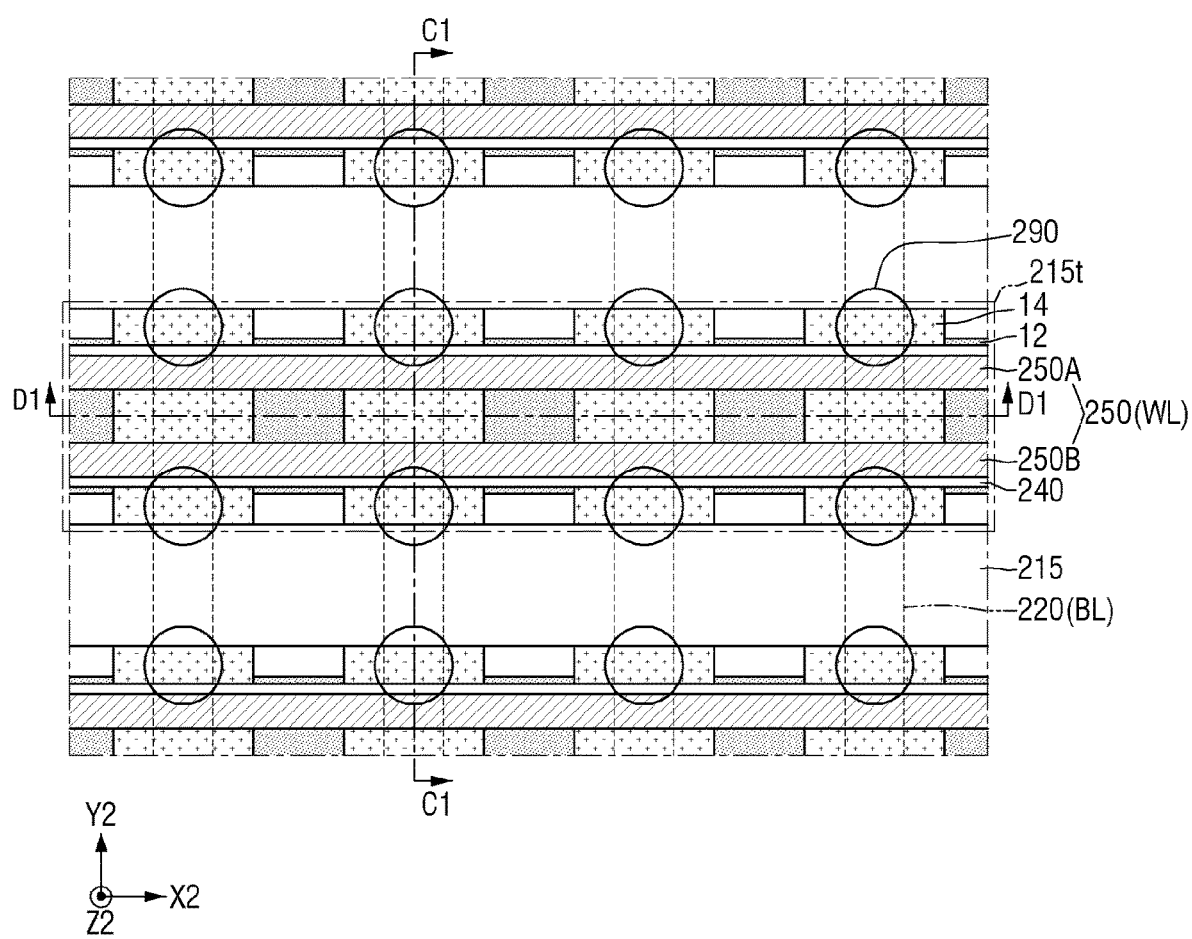
FIG. 6 is another example layout view illustrating a semiconductor device according to some embodiments.
Figure 8:
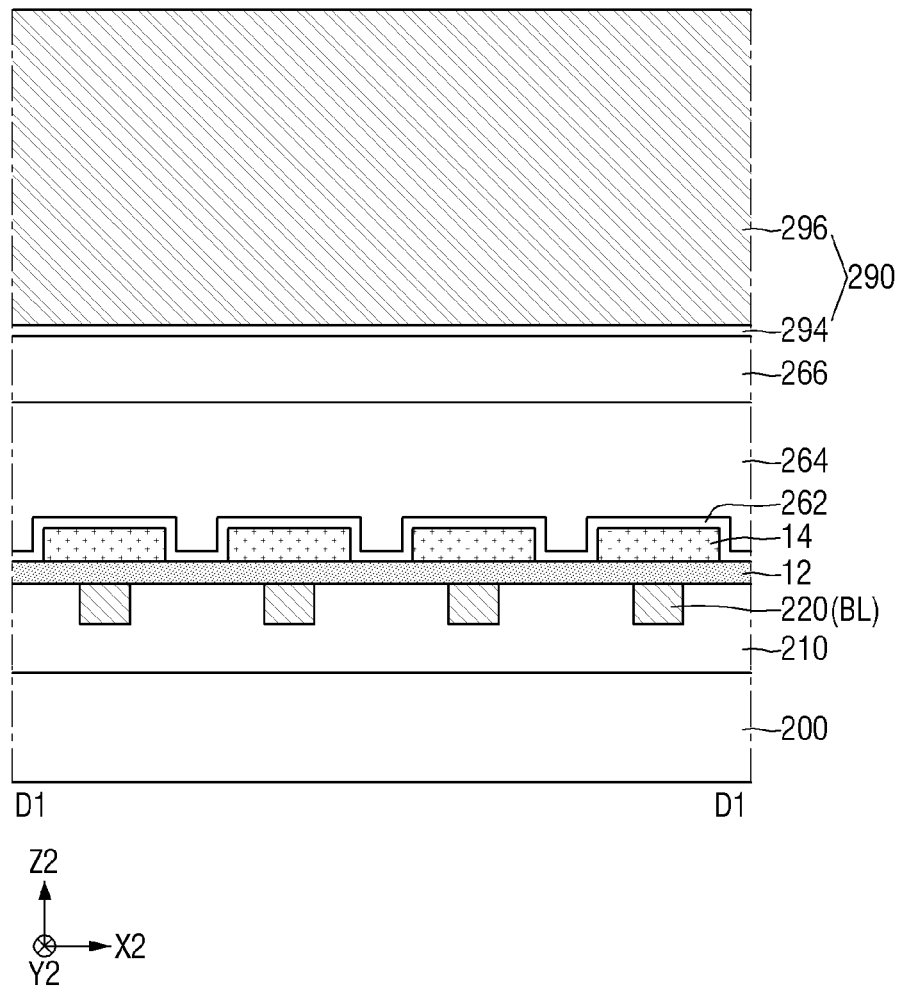
FIG. 8 is a cross-sectional view taken along line D1-D1 of FIG. 6.

FIG. 6 is another example layout view illustrating a semiconductor device according to some embodiments. FIG. 7 is a cross-sectional view taken along the line C1-C1 of FIG. 6. FIG. 8 is a cross-sectional view taken along line D1-D1 of FIG. 6. For convenience of description, portions duplicated with those described with reference to FIGS. 1 and 2 will be described briefly or omitted.

Referring to FIGS. 6 to 8, a semiconductor device according to some embodiments includes a third substrate 200, a second conductive line 220 (BL), a lower contact layer 230, a first oxide semiconductor layer 12, an isolation insulating layer 215, a second oxide semiconductor layer 14, a third gate dielectric layer 240, a gate line 250 (WL), an upper contact layer 270, and a second capacitor structure 290.

The third substrate 200 may be a structure in which a base substrate and an epitaxial layer are deposited, but embodiments are not limited thereto. The third substrate 200 may be a silicon substrate, a gallium arsenide substrate, a silicon germanium substrate, and/or a semiconductor-on-insulator (SOI) substrate. The following description will be based on the third substrate 200 being a silicon substrate by way of example.

The second conductive line 220 may be formed on the third substrate 200. For example, a first lower insulating layer 210 may be formed on the third substrate 200. The second conductive line 220 may be disposed on the first lower insulating layer 210. The second conductive line 220 may longitudinally extend in a fourth direction Y2. A plurality of second conductive lines 220 may extend in the fourth direction Y2, and may be spaced from each other at generally constant intervals in a fifth direction X2 crossing the fourth direction Y2. The first lower insulating layer 210 may be formed to at least partially fill a space between the second conductive lines 220. In some embodiments, an upper surface of the first lower insulating layer 210 may be disposed at the same level as that of the second conductive lines 220. The second conductive line 220 may serve as a bit line BL of the semiconductor memory device according to some embodiments.

The second conductive line 220 may include doped polysilicon, a metal, a conductive metal nitride, a conductive metal silicide, a conductive metal oxide, or combinations thereof. For example, the second conductive line 220 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$ or combinations thereof. In other embodiments, the second conductive line 220 may include a two-dimensional semiconductor material. The two-dimensional semiconductor material may include graphene, carbon nanotube, or combinations thereof. The second conductive line 220 may include a single layer or multiple layers of the above-described conductive materials.

The lower contact layer 230 may be formed on the second conductive line 220. For example, the lower contact layer 230 may extend along the upper surface of the second conductive line 220. The lower contact layer 230 may connect the second conductive line 220 with the second oxide semiconductor layer 14. The lower contact layer 230 may include, but is not limited to, a conductive material, for example, a metal, a conductive metal nitride, a conductive metal carbonitride, a conductive metal carbide, a metal silicide, a doped semiconductor material, a conductive metal oxynitride, and/or a two-dimensional (2D) material. For example, the lower contact layer 230 may include indium tin oxide (ITO).

The first oxide semiconductor layer 12 may be formed on the second conductive line 220. For example, the first oxide semiconductor layer 12 may extend along the upper surface of the second conductive line 220. In some embodiments, the first oxide semiconductor layer 12 may be disposed at the same level as the lower contact layer 230. For example, as shown in FIG. 7, the lower contact layer 230 may be formed on a portion of the upper surface of the second conductive line 220, and the first oxide semiconductor layer 12 may be formed on another portion of the upper surface of the second conductive line 220.

In some embodiments, the first oxide semiconductor layer 12 may connect the second conductive line 220 to the second oxide semiconductor layer 14. In some embodiments, the first oxide semiconductor layer 12 may longitudinally extend in the fifth direction X2. As shown in FIG. 8, the first oxide semiconductor layer 12 may be connected to the plurality of second conductive lines 220 arranged along the fifth direction X2.

The isolation insulating layer 215 may be formed on the second conductive line 220. For example, the isolation insulating layer 215 may be formed on the lower contact layer 230. The isolation insulating layer 215 may include a channel trench 215*t* that longitudinally extends in the fifth direction X2. In some embodiments, the isolation insulating layer 215 may form a plurality of insulating patterns that extend in the fifth direction X2 and are spaced apart from each other by the channel trench 215*t*. The channel trench 215*t* may expose at least a portion of the lower contact layer 230 and at least a portion of the first oxide semiconductor layer 12. For example, the channel trench 215*t* may expose an upper surface of the lower contact layer 230 and an upper surface of the first oxide semiconductor layer 12.

The isolation insulating layer 215 may include \, for example, a silicon oxide, a silicon oxynitride, a silicon nitride, and/or a low-k material having a dielectric constant less than that of the silicon oxide, but embodiments are not limited thereto.

The second oxide semiconductor layer 14 may be formed on the second conductive line 220. The second oxide semiconductor layer 14 may be formed in the channel trench 215*t*. For example, the second oxide semiconductor layer 14 may extend along a side and a lower surface of the channel trench 215*t*. The second oxide semiconductor layer 14 may (electrically) be connected to the second conductive line 220, and may (physically) be in contact with the first oxide semiconductor layer 12. For example, the second oxide semiconductor layer 14 that extends along the lower surface of the channel trench 215*t* may be in physical contact with the upper surface of the lower contact layer 230 and the upper surface of the first oxide semiconductor layer 12.

The semiconductor device according to some embodiments may be a semiconductor memory device that includes a vertical channel transistor (VCT). The vertical channel transistor may refer to a structure in which a channel length of a channel layer (e.g., second oxide semiconductor layer 14) extends in a second vertical direction Z2 perpendicular to an upper surface of the third substrate 200. For example, the second oxide semiconductor layer 14 may include a first source/drain area and a second source/drain area, which are arranged along a vertical direction (e.g., fourth direction Y2) and the second vertical direction Z2 crossing the fifth direction X2. For example, a lower portion of the second oxide semiconductor layer 14 may serve as the first source/drain area, and an upper portion of the second oxide semiconductor layer 14 may serve as the second source/drain area. An area of the second oxide semiconductor layer 14 between the first source/drain area and the second source/drain area may serve as a channel area.

In some embodiments, a plurality of second oxide semiconductor layers 14 spaced apart from each other may be formed on the second conductive line 220. The plurality of second oxide semiconductor layers 14 may be arranged in the form of a matrix by being spaced apart from each other in the fourth direction Y2 and the fifth direction X2. In some embodiments, the first oxide semiconductor layer 12, which extends in the fifth direction X2, may be in physical contact with the plurality of second oxide semiconductor layers 14 arranged along the fifth direction X2.

The third gate dielectric layer 240 may be formed on the second oxide semiconductor layer 14 in the channel trench 215*t*. The third gate dielectric layer 240 may be interposed between the second oxide semiconductor layer 14 and the gate line 250. For example, the third gate dielectric layer 240 may extend along an inner side and an upper surface of the second oxide semiconductor layer 14. The third gate dielectric layer 240 may include, for example, a silicon oxide, a silicon oxynitride, a silicon nitride, and/or a high-k material having a dielectric constant greater than that of the silicon oxide, but embodiments are not limited thereto.

The gate line 250 may be formed on the third gate dielectric layer 240 in the channel trench 215t. The gate line 250 may longitudinally extend in the fifth direction X2. The gate line 250 may include doped polysilicon, a metal, a conductive metal nitride, a conductive metal silicide, a conductive metal oxide, or combinations thereof. For example, the gate line 250 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof.

In some embodiments, the gate line 250 may include a third gate electrode 250A and a fourth gate electrode 250B, which face each other in one channel trench 215t. The third gate electrode 250A and the fourth gate electrode 250B may be spaced apart from each other in the fourth direction Y2 and longitudinally extend in the fifth direction X2. In this case, a structure in which two transistors are provided per second oxide semiconductor layer 14 may be implemented. For example, the third gate electrode 250A may serve as a first word line of the semiconductor device according to some embodiments, and the fourth gate electrode 250B may serve as a second word line of the semiconductor device according to some embodiments.

In some embodiments, a first barrier insulating layer 262 and a gap fill insulating layer 264 may be formed between the third gate electrode 250A and the fourth gate electrode 250B. The third gate electrode 250A and the fourth gate electrode 250B may be separated from each other by the first barrier insulating layer 262 and the gap fill insulating layer 264. For example, the first barrier insulating layer 262 may extend along an inner side of the third gate electrode 250A, the upper surface of the second oxide semiconductor layer 14, and an inner side of the fourth gate electrode 250B. The gap fill insulating layer 264 may be formed on the first barrier insulating layer 262 to at least partially fill an area between the third gate electrode 250A and the fourth gate electrode 250B.

Each of the first barrier insulating layer 262 and the gap fill insulating layer 264 may include, but is not limited to, a silicon oxide, a silicon oxynitride, a silicon nitride, or combinations thereof. For example, the first barrier insulating layer 262 may include a silicon nitride, and the gap fill insulating layer 264 may include a silicon oxide.

In some embodiments, a third gate capping pattern 266 may be formed on the gate line 250. For example, the third gate capping pattern 266 may at least partially cover an upper surface of the gate line 250, an upper surface of the first barrier insulating layer 262, and an upper surface of the gap fill insulating layer 264. The third gate capping pattern 266 may include, but is not limited to, a silicon nitride.

The upper contact layer 270 may be formed on the second oxide semiconductor layer 14. For example, the upper contact layer 270 may be connected to the upper surface of the second oxide semiconductor layer 14. The upper contact layer 270 may connect the second oxide semiconductor layer 14 to the second capacitor structure 290. The upper contact layer 270 may include, but is not limited to, a conductive material, for example, a metal, a conductive metal nitride, a conductive metal carbonitride, a conductive metal carbide, a metal silicide, a doped semiconductor material, a conductive metal oxynitride, and/or a two-dimensional (2D) material.

In some embodiments, two upper contact layers 270 may be formed per second oxide semiconductor layer 14. For example, an upper portion of the second oxide semiconductor layer 14, which is adjacent to the third gate electrode 250A, may be connected to one upper contact layer 270, and an upper portion of the second oxide semiconductor layer 14, which is adjacent to the fourth gate electrode 250B, may be connected to the other upper contact layer 270.

The second capacitor structure 290 may be formed on the isolation insulating layer 215 and the upper contact layer 270. The second capacitor structure 290 may be connected to an upper surface of the upper contact layer 270. The second capacitor structure 290 may be controlled by using the second conductive line 220 and the gate line 250 to store data.

The second capacitor structure 290 may include a second lower electrode 292, a second capacitor dielectric layer 294, and a second upper electrode 296. The second capacitor structure 290 may store charges in the second capacitor dielectric layer 294 by using a potential difference generated between the second lower electrode 292 and the second upper electrode 296.

The second lower electrode 292 may be connected to the upper contact layer 270. In FIGS. 7 and 8, the second lower electrode 292 is shown only in the form of a pillar that extends from the upper surface of the upper contact layer 270 in the second vertical direction Z2, but this is only an example. As another example, the second lower electrode 292 may be in the form of a cylinder that extends from the upper surface of the upper contact layer 270 in the second vertical direction Z2. In some embodiments, the plurality of second lower electrodes 292 may be arranged in the form of a matrix.

The second capacitor dielectric layer 294 may be formed on the second lower electrode 292. In some embodiments, the second capacitor dielectric layer 294 may extend to be conformal along a side and an upper surface of the second lower electrode 292 and an upper surface of the isolation insulating layer 215.

The second upper electrode 296 may be formed on the second capacitor dielectric layer 294. In FIGS. 7 and 8, the second upper electrode 296 is shown to at least partially fill an area between the second lower electrodes 292 adjacent to each other, but this is only an example. In other embodiments, the second upper electrode 296 may extend to be conformal along a profile of the second capacitor dielectric layer 294.

Figure 9:
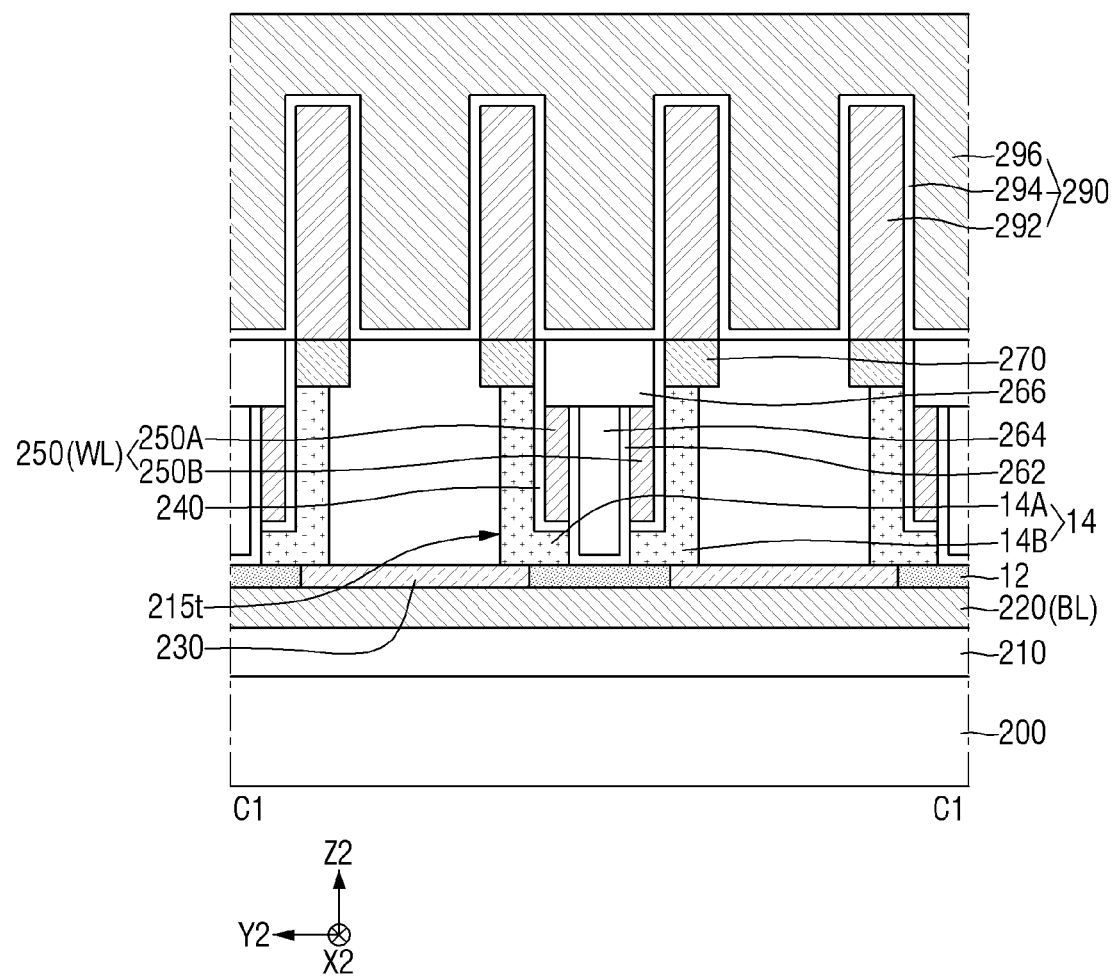
FIGS. 9 to 11 are various example cross-sectional views illustrating a semiconductor device according to some embodiments.
Figure 10:
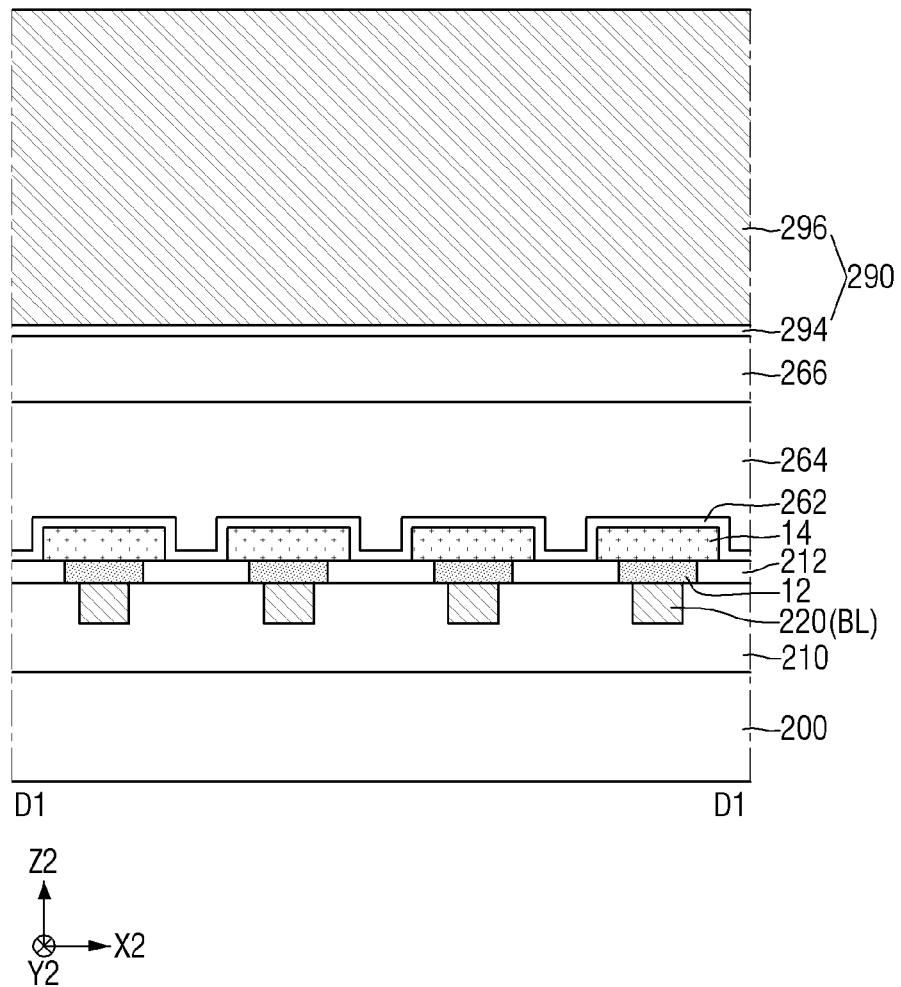
Figure 11:
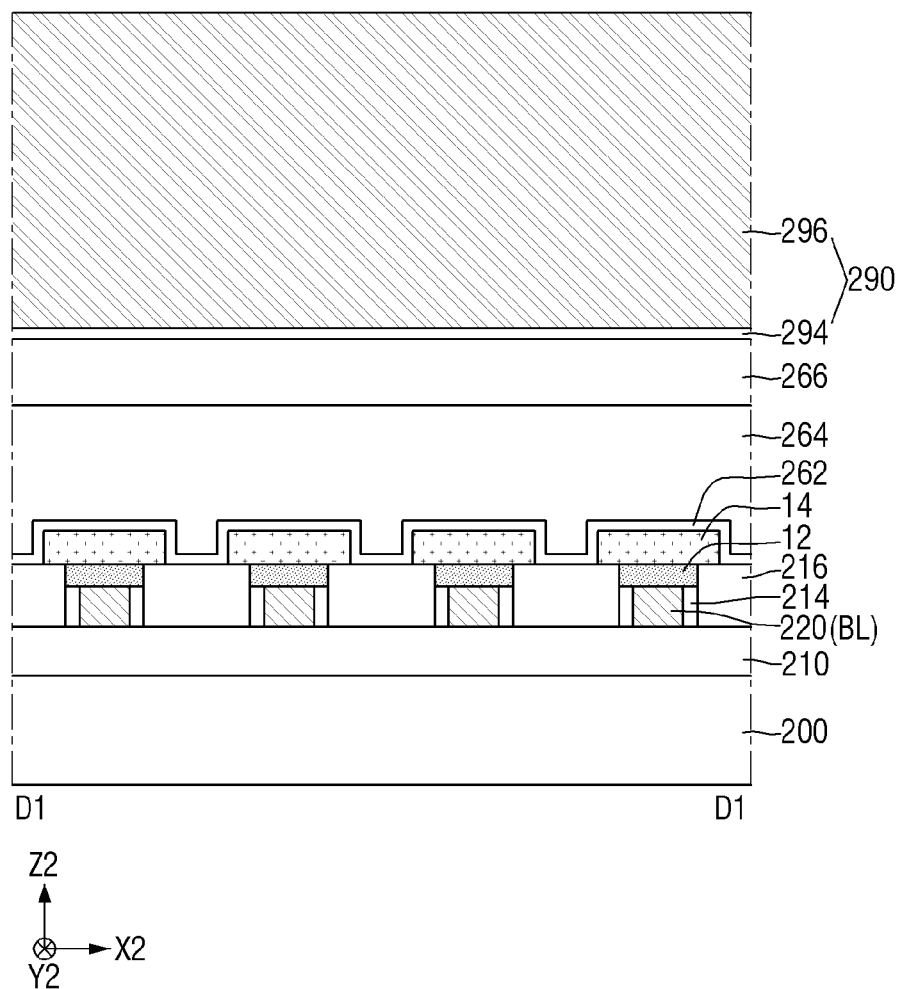

FIGS. 9 to 11 are various example cross-sectional views illustrating a semiconductor device according to some embodiments. For convenience of description, portions duplicated with those described with reference to FIGS. 1, 2 and 6 to 8 will be described briefly or omitted.

Referring to FIG. 9, in the semiconductor device according to some embodiments, the second oxide semiconductor layer 14 includes a first channel portion 14A and a second channel portion 14B, which face each other.

The first channel portion 14A and the second channel portion 14B may be spaced apart from each other in the fourth direction Y2. For example, the first channel portion 14A may extend along one side of the channel trench 215t, and the second channel portion 14B may extend along the other side of the channel trench 215t.

In some embodiments, the first channel portion 14A and the second channel portion 14B may be separated from each other by the first barrier insulating layer 262 and the gap fill insulating layer 264. For example, the lowest surface of the first barrier insulating layer 262 may be formed to be equal to or lower than the lowest surface of the second oxide semiconductor layer 14. As a result, the second oxide semiconductor layer 14 may be cut to form the first channel portion 14A and the second channel portion 14B.

Referring to FIG. 10, in the semiconductor device according to some embodiments, a plurality of first oxide semiconductor layers 12 are arranged along the fifth direction X2.

The plurality of first oxide semiconductor layers 12 arranged along the fifth direction X2 may be spaced apart from each other by the second lower insulating layer 212. In some embodiments, the plurality of first oxide semiconductor layers 12 may correspond to the plurality of second oxide semiconductor layers 14 and the plurality of second conductive lines 220, which are arranged along the fifth direction X2. In this case, each of the first oxide semiconductor layers 12 may connect one second conductive line 220 to one second oxide semiconductor layer 14.

Referring to FIG. 11, in the semiconductor device according to some embodiments, at least a portion of the second oxide semiconductor layer 14 is in physical contact with the lower oxide layer 216.

The lower oxide layer 216 may be formed on the first lower insulating layer 210. For example, the lower oxide layer 216 may at least partially cover a side of the second conductive line 220. In some embodiments, the lower oxide layer 216 may at least partially cover the side of the second conductive line 220 and a side of the first oxide semiconductor layer 12. The second oxide semiconductor layer 14 may be in physical contact with an upper surface of the lower oxide layer 216.

The lower oxide layer 216 may include an oxide. For example, the lower oxide layer 216 may include a silicon oxide. As the second oxide semiconductor layer 14 is in physical contact with the lower oxide layer 216, oxygen atoms of the lower oxide layer 216 may be diffused into the second oxide semiconductor layer 14. As a result, the second crystalline oxide semiconductor material of the second oxide semiconductor layer 14 may be cured, and the semiconductor device may be provided with improved performance and reliability.

In some embodiments, a second barrier insulating layer 214 may be interposed between the second conductive line 220 and the lower oxide layer 216. The second barrier insulating layer 214 may at least partially cover the side of the second conductive line 220. The second barrier insulating layer 214 may reduce or prevent the oxygen atoms of the lower oxide layer 216 from being diffused into the second conductive line 220. For example, the second barrier insulating layer 214 may include, but is not limited to, a silicon nitride.

Figure 12:
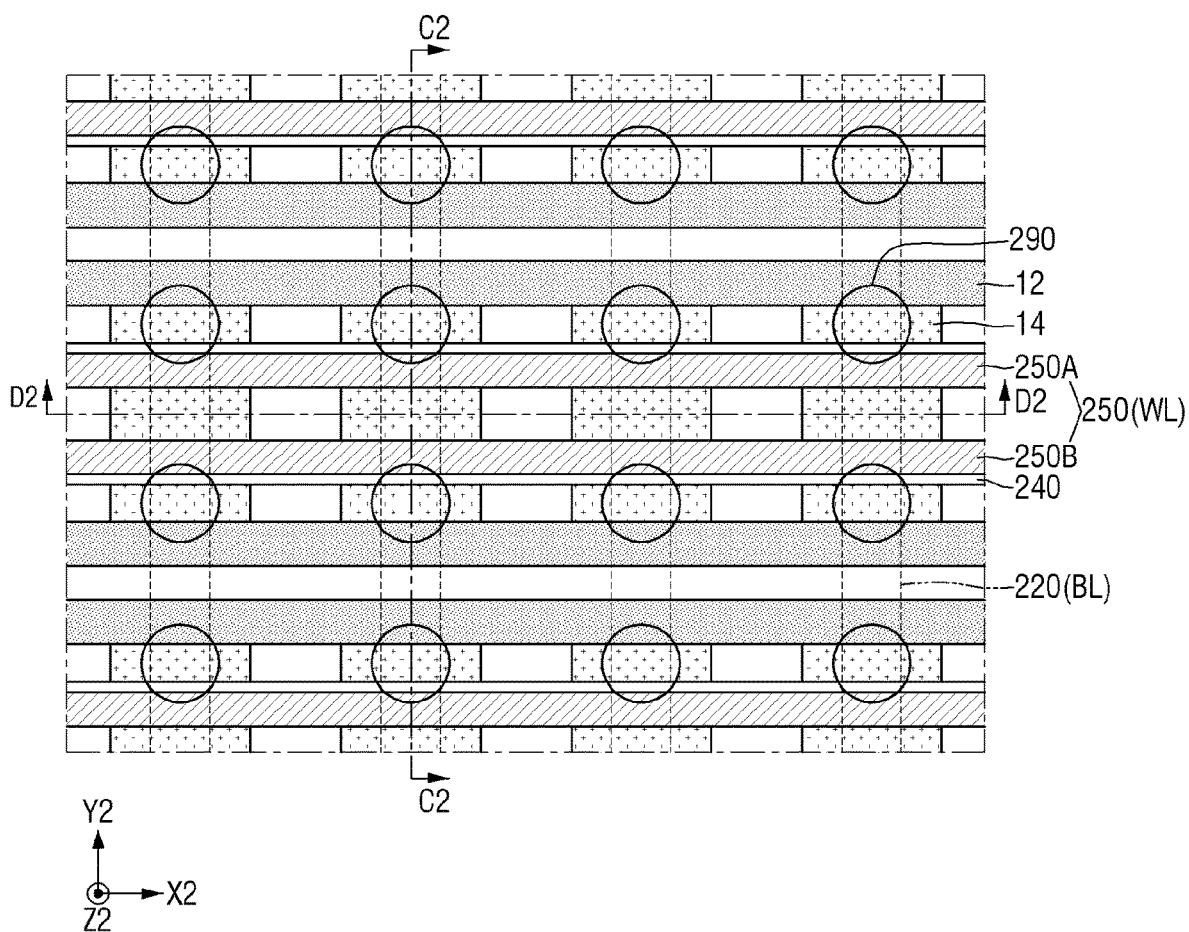
FIG. 12 is another example layout view illustrating a semiconductor device according to some embodiments.
Figure 13:
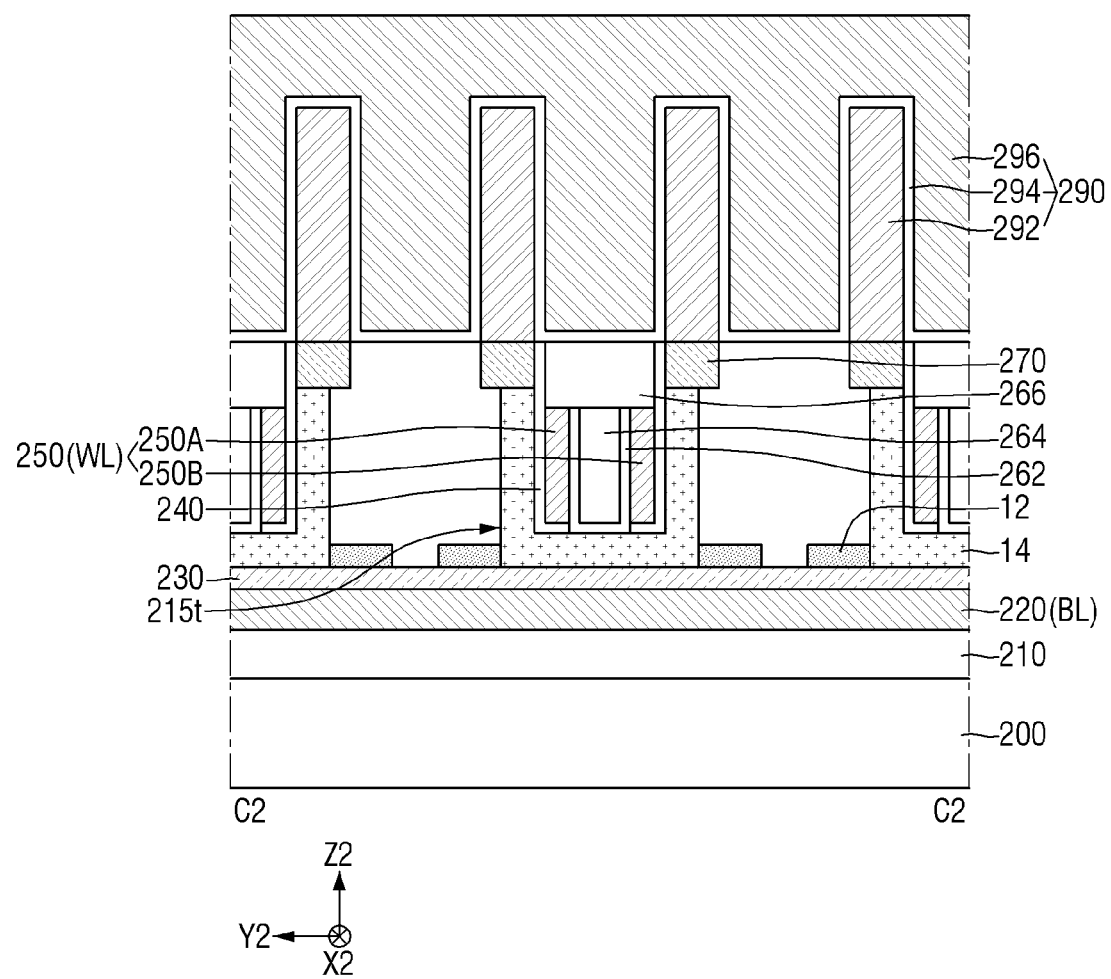
FIG. 13 is a cross-sectional view taken along line C2-C2 of FIG. 12.
Figure 14:
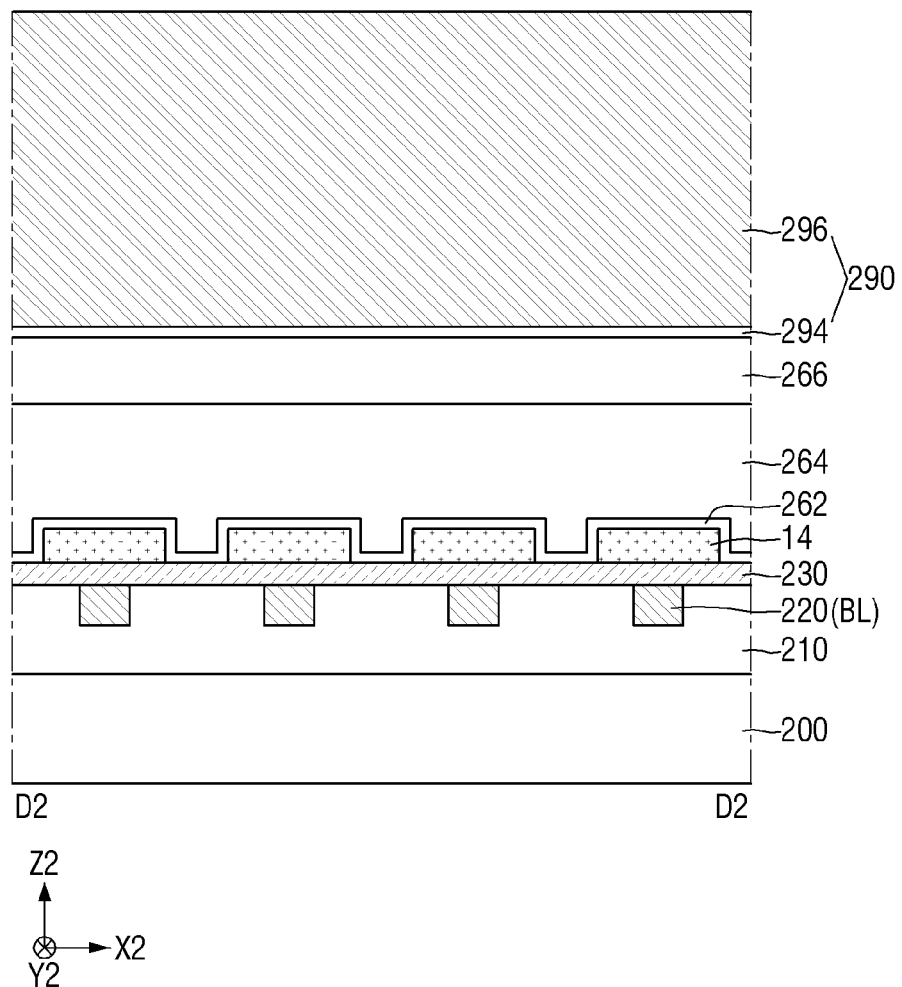
FIG. 14 is a cross-sectional view taken along line D2-D2 of FIG. 12.

FIG. 12 is another example layout view illustrating a semiconductor device according to some embodiments. FIG. 13 is a cross-sectional view taken along line C2-C2 of FIG. 12. FIG. 14 is a cross-sectional view taken along line D2-D2 of FIG. 12. For convenience of description, portions duplicated with those described with reference to FIGS. 1, 2 and 6 to 8 will be described briefly or omitted.

Referring to FIGS. 12 to 14, in a semiconductor device according to some embodiments, the second oxide semiconductor layer 14 is in physical contact with the side of the first oxide semiconductor layer 12.

For example, as shown in FIG. 13, the first oxide semiconductor layer 12 may be formed on a portion of the upper surface of the lower contact layer 230, and the second oxide semiconductor layer 14 may be formed on another portion of the upper surface of the lower contact layer 230. Also, the channel trench 215t may expose the upper surface of the lower contact layer 230 and the side of the first oxide semiconductor layer 12. As a result, the second oxide semiconductor layer 14 may be in physical contact with the upper surface of the lower contact layer 230 and the side of the first oxide semiconductor layer 12.

In some embodiments, the lower contact layer 230 may at least partially cover the upper surface of the second conductive line 220 and the upper surface of the first lower insulating layer 210. As shown in FIG. 14, the lower contact layer 230 may be connected to the plurality of second conductive lines 220 arranged along the fifth direction X2. The lower contact layer 230 may be connected to the plurality of second oxide semiconductor layers 14 spaced apart from each other in the fourth direction Y2 and the fifth direction X2.

Figure 15:
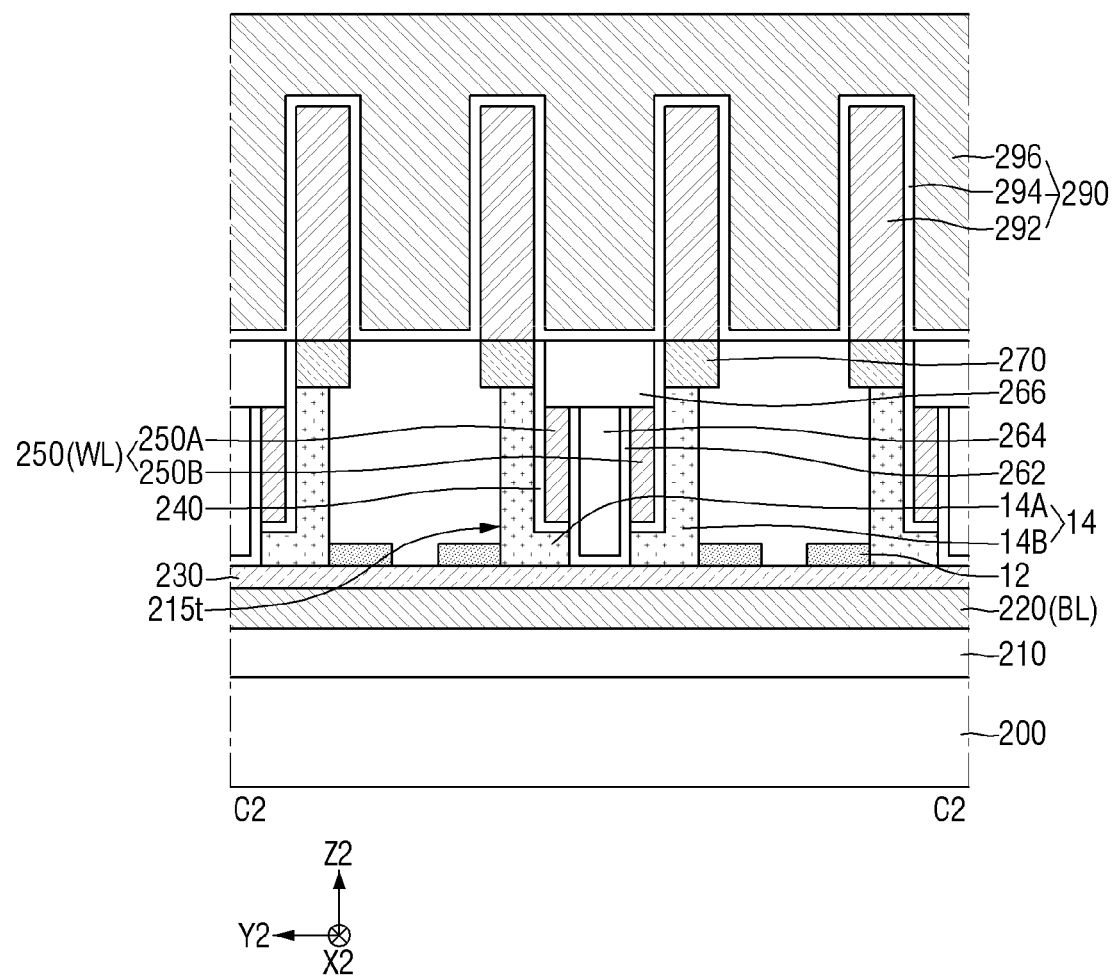
FIGS. 15 to 17 are various example cross-sectional views illustrating a semiconductor device according to some embodiments.
Figure 16:
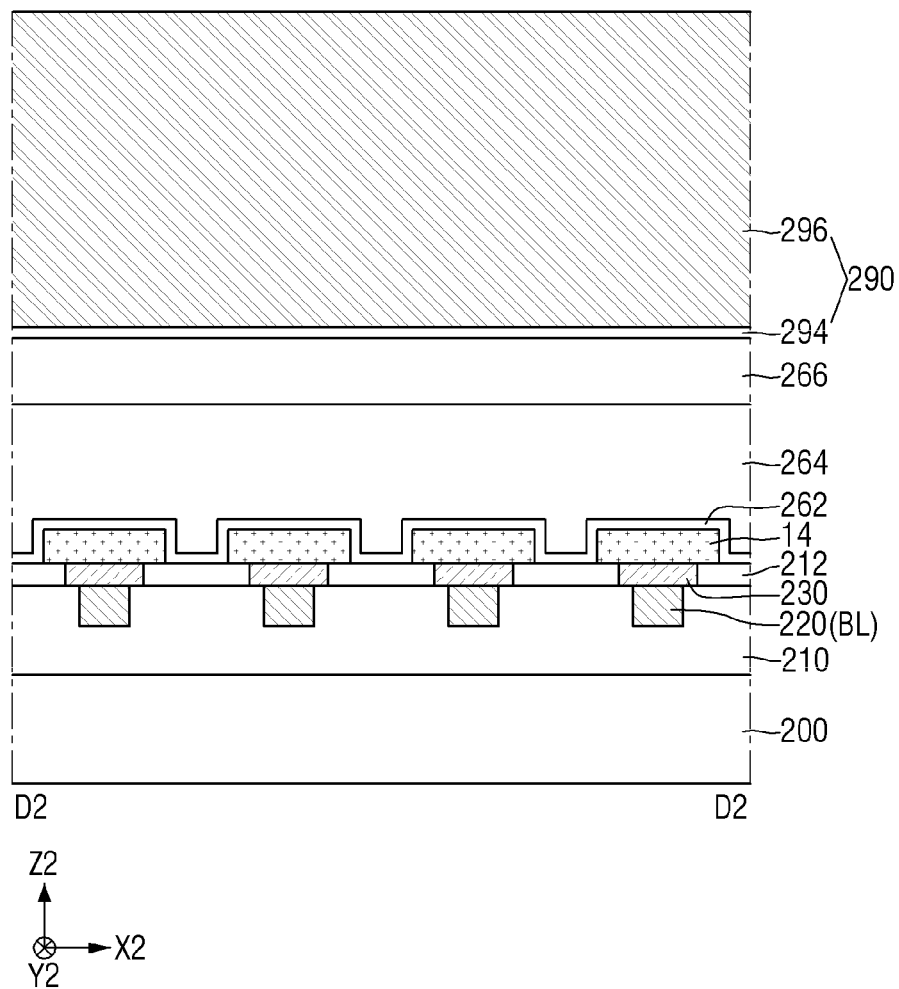
Figure 17:
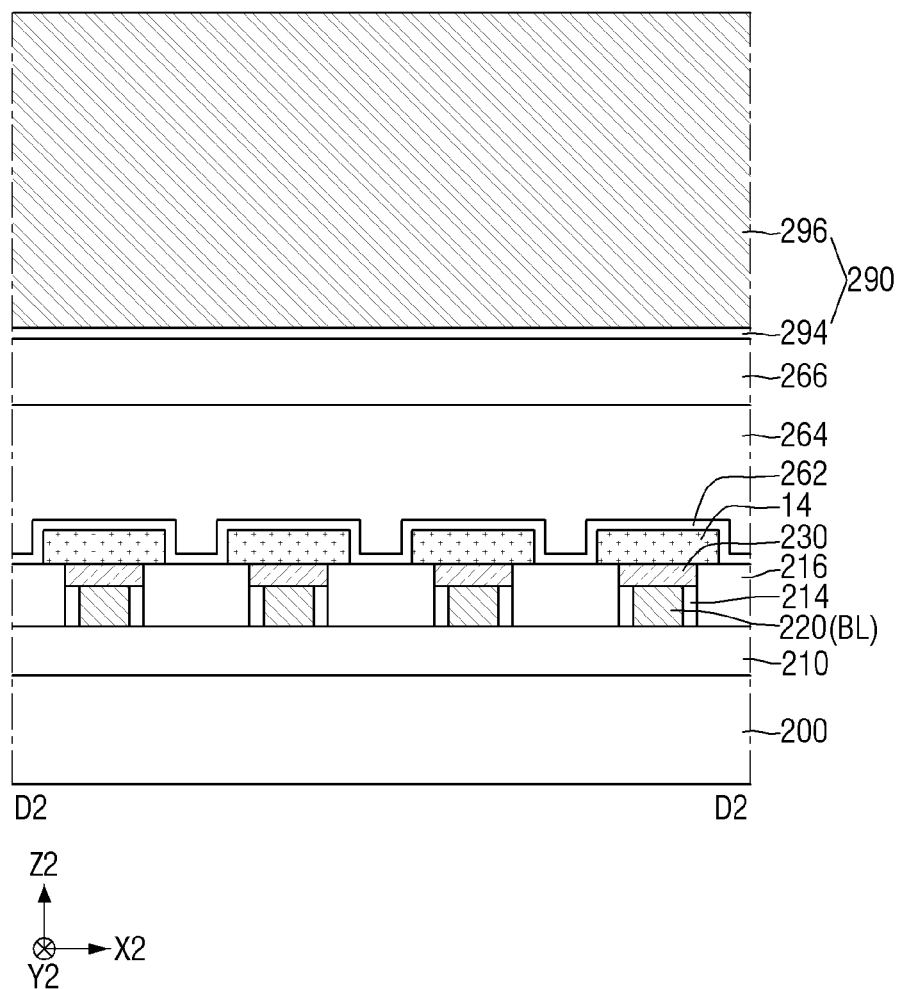

FIGS. 15 to 17 are various example cross-sectional views illustrating a semiconductor device according to some embodiments. For convenience of description, portions duplicated with those described with reference to FIGS. 1, 2 and 6 to 14 will be described briefly or omitted.

Referring to FIG. 15, in a semiconductor device according to some embodiments, the second oxide semiconductor layer 14 includes a first channel portion 14A and a second channel portion 14B, which face each other. Since the second oxide semiconductor layer 14 is similar to that described above with reference to FIG. 9, its detailed description will be omitted.

Referring to FIG. 16, in a semiconductor device according to some embodiments, a plurality of lower contact layers 230 are arranged along the fifth direction X2.

The plurality of lower contact layers 230 arranged along the fifth direction X2 may be spaced apart from each other by the second lower insulating layer 212. In some embodiments, the plurality of lower contact layers 230 may correspond to the plurality of second oxide semiconductor layers 14 and the plurality of second conductive lines 220, which are arranged along the fifth direction X2. In this case, each of the lower contact layers 230 may connect one second conductive line 220 to the plurality of second oxide semiconductor layers 14 arranged along the fourth direction Y2.

Referring to FIG. 17, in a semiconductor device according to some embodiments, at least a portion of the second oxide semiconductor layer 14 is in physical contact with the lower oxide layer 216. Because the second oxide semiconductor layer 14 is similar to that described above with reference to FIG. 11, its detailed description will be omitted.

Figure 18:
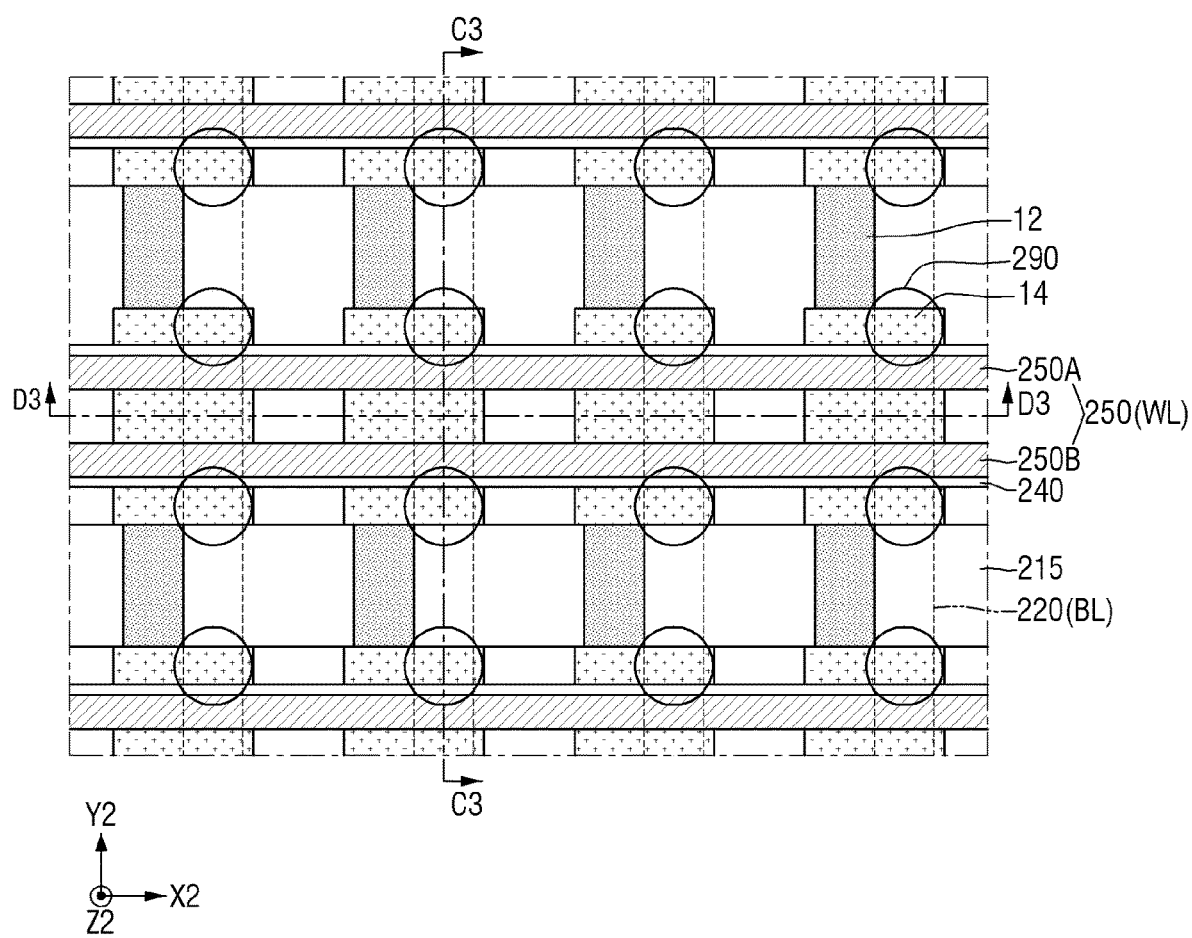
FIG. 18 is another example layout view illustrating a semiconductor device according to some embodiments.
Figure 19:
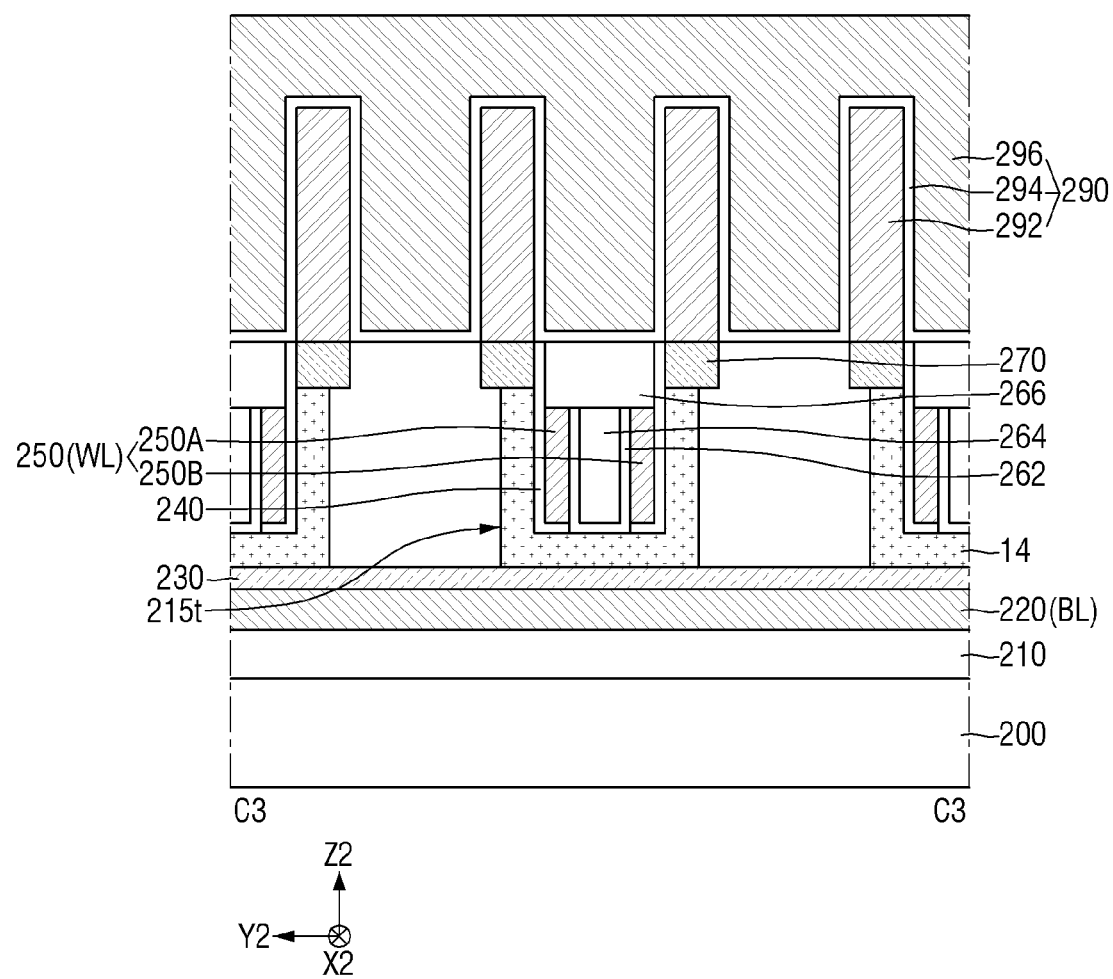
FIG. 19 is a cross-sectional view taken along line C3-C3 of FIG. 18.
Figure 20:
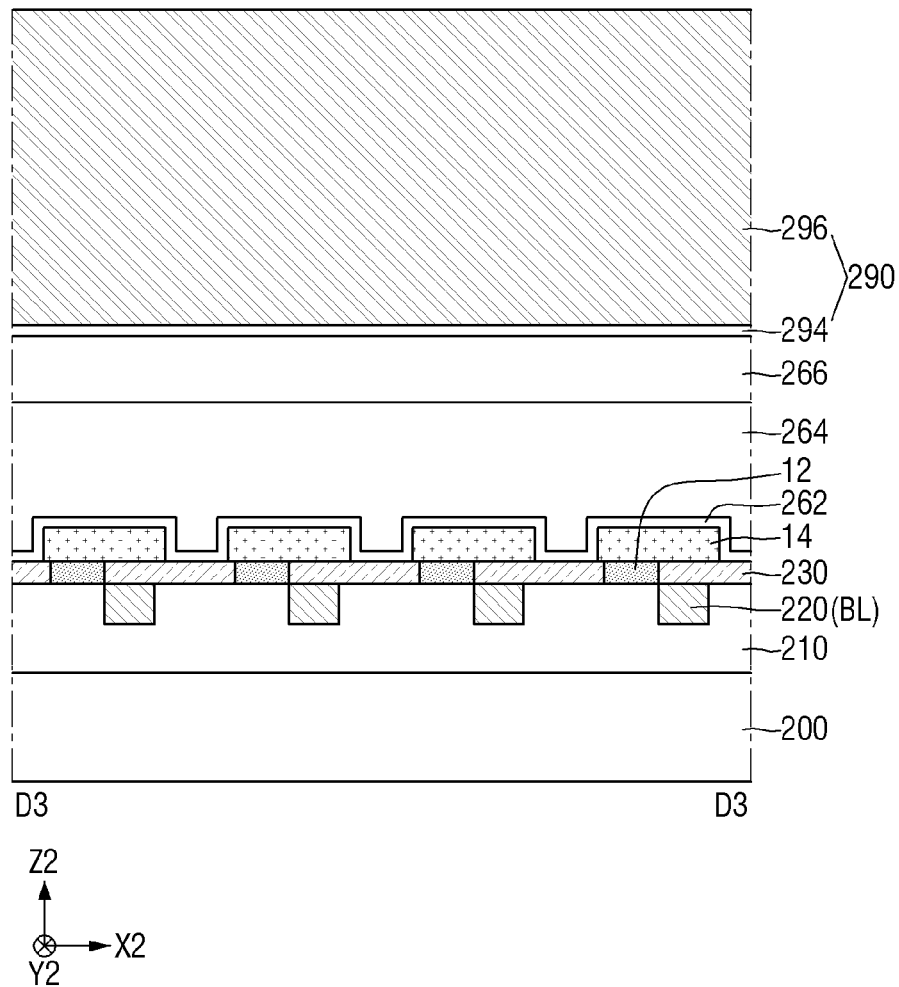
FIG. 20 is a cross-sectional view taken along line D3-D3 of FIG. 18.

FIG. 18 is another example layout view illustrating a semiconductor device according to some embodiments. FIG. 19 is a cross-sectional view taken along line C3-C3 of FIG. 18. FIG. 20 is a cross-sectional view taken along line D3-D3 of FIG. 18.

Referring to FIGS. 18 to 20, in a semiconductor device according to some embodiments, the first oxide semiconductor layer 12 longitudinally extends in the fourth direction Y2.

As shown in FIG. 18, the first oxide semiconductor layer 12 may be in physical contact with the plurality of second oxide semiconductor layers 14 arranged along the fourth direction Y2. The plurality of first oxide semiconductor layers 12 may be arranged along the fifth direction X2.

Although FIGS. 18 and 20 show that the first oxide semiconductor layer 12 does not overlap the second conductive line 220 in the second vertical direction Z2, this is only an example. As another example, at least a portion of the first oxide semiconductor layer 12 may overlap the second conductive line 220 in the second vertical direction Z2.

Figure 21:
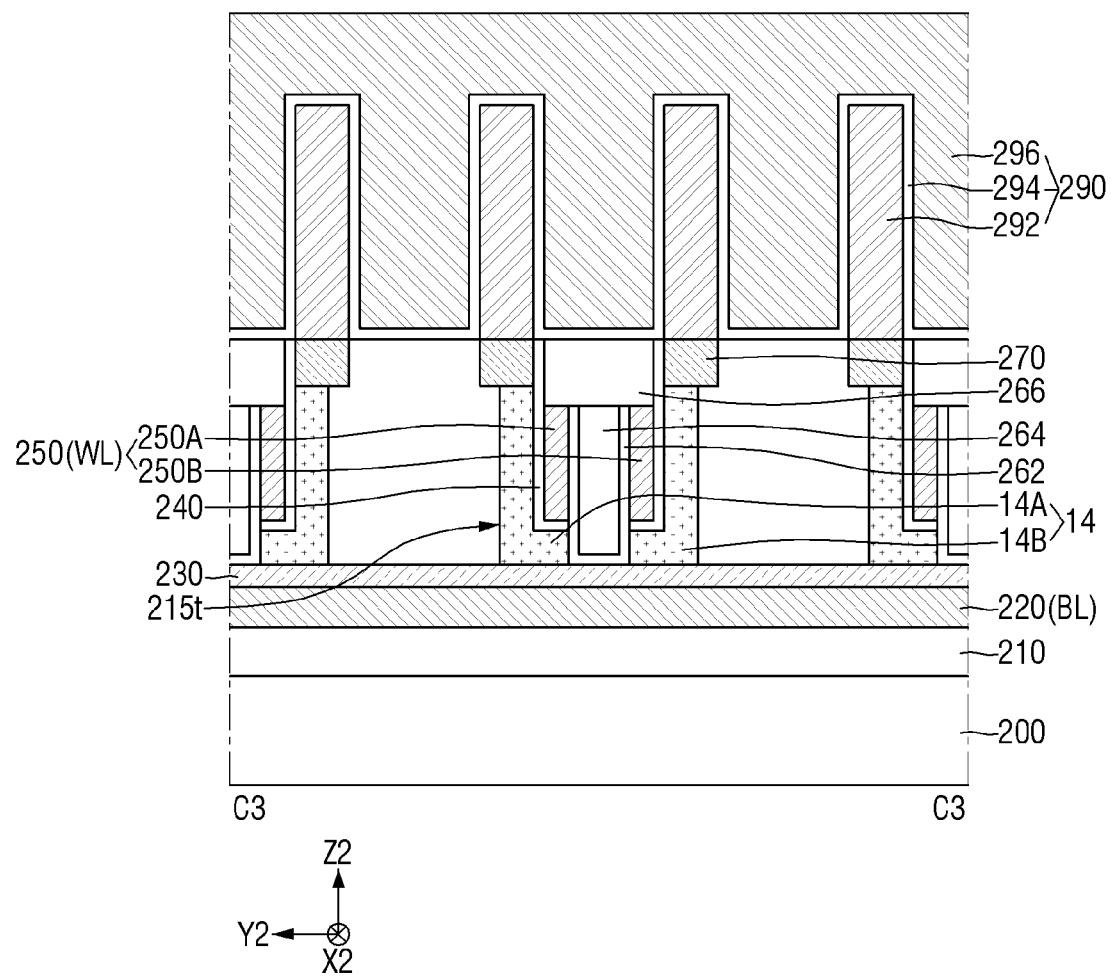
FIGS. 21 to 23 are various example cross-sectional views illustrating a semiconductor device according to some embodiments.
Figure 22:
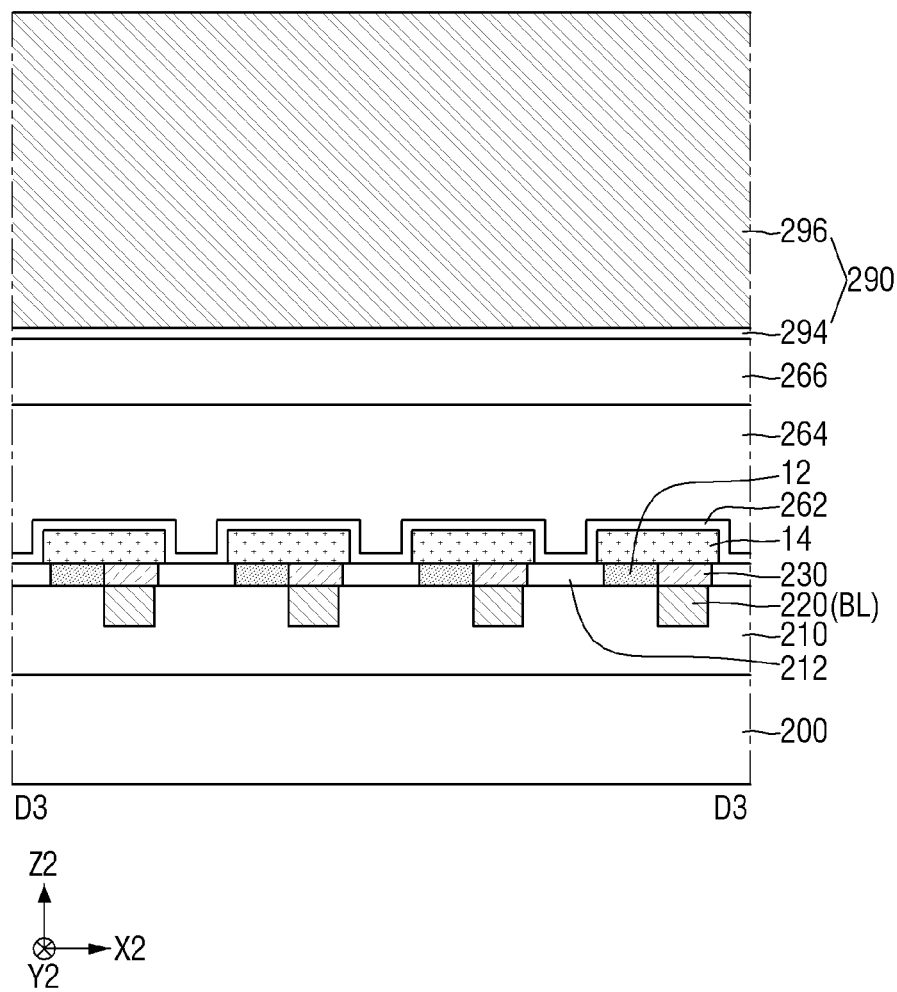
Figure 23:
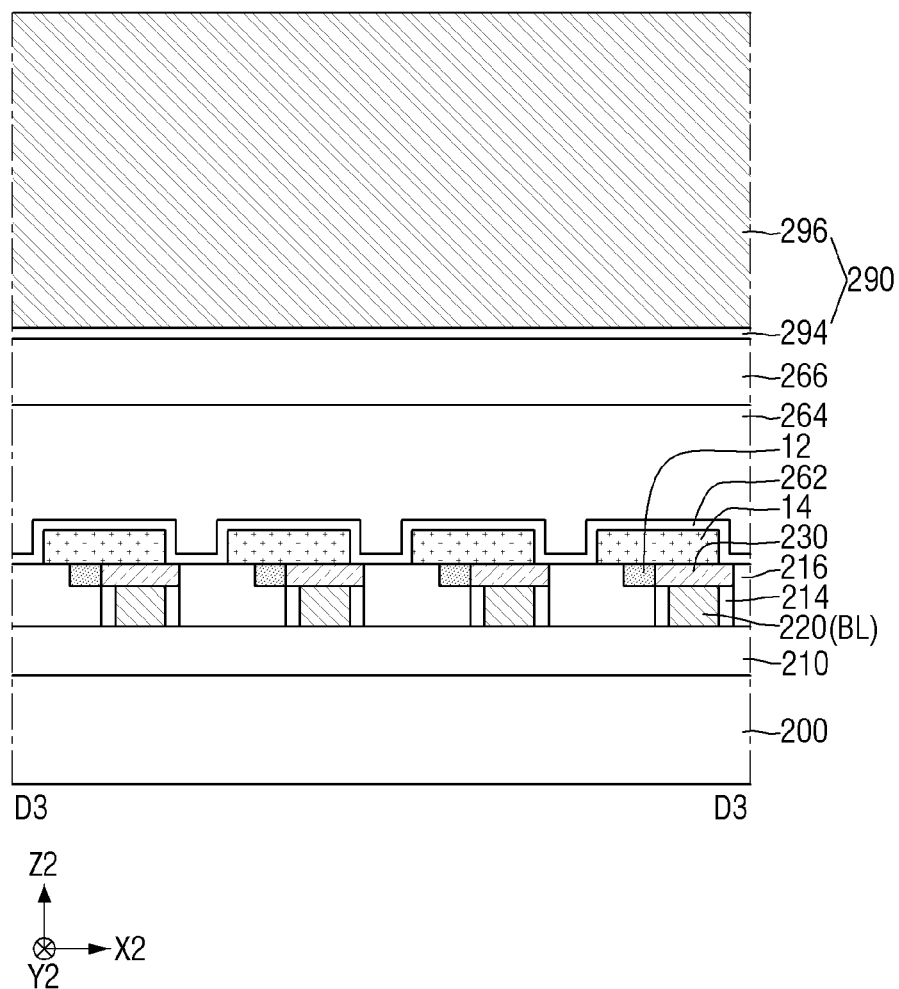

FIGS. 21 to 23 are various example cross-sectional views illustrating a semiconductor device according to some embodiments. For convenience of description, portions duplicated with those described with reference to FIGS. 1, 2 and 6 to 20 will be described briefly or omitted.

Referring to FIG. 21, in a semiconductor device according to some embodiments, the second oxide semiconductor layer 14 includes a first channel portion 14A and a second channel portion 14B, which face each other. Because the second oxide semiconductor layer 14 is similar to that described above with reference to FIG. 9, its detailed description will be omitted.

Referring to FIG. 22, in a semiconductor device according to some embodiments, the plurality of lower contact layers 230 are arranged along the fifth direction X2. Because the lower contact layers 230 are similar to those described above with reference to FIG. 16, their detailed description will be omitted.

Referring to FIG. 23, in a semiconductor device according to some embodiments, at least a portion of the second oxide semiconductor layer 14 is in physical contact with the lower oxide layer 216. Because the second oxide semiconductor layer 14 is similar to that described above with reference to FIG. 11, its detailed description will be omitted.

Hereinafter, a method for fabricating a semiconductor device according to example embodiments will be described with reference to FIGS. 1 to 33.

FIGS. 24 to 27 are views illustrating intermediate operations of a method for fabricating a semiconductor device according to some embodiments. For convenience of description, portions duplicated with those described with reference to FIGS. 1 and 2 will be described briefly or omitted.

Figure 24:
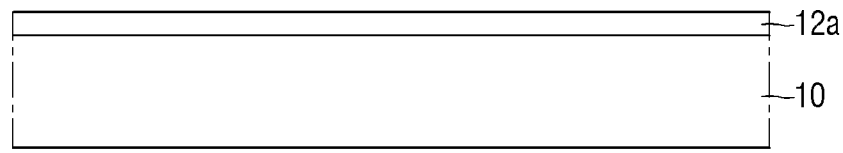
FIGS. 24 to 27 are views illustrating intermediate operations of a method for fabricating a semiconductor device according to some embodiments.

Referring to FIG. 24, a first preliminary oxide semiconductor layer 12a is formed on a first substrate 10.

The first preliminary oxide semiconductor layer 12a may be formed by, for example, a deposition process. The first preliminary oxide semiconductor layer 12a may include a binary or ternary oxide semiconductor material containing a first metal element, or a ternary oxide semiconductor material containing first and second metal elements different from each other. The binary or ternary oxide semiconductor material may be, but not limited to, zinc oxide (ZnO, $Zn_xO$), gallium oxide (GaO, $Ga_xO$), tin oxide (TiO, $Ti_xO$), zinc oxynitride (ZnON, $Zn_xO_yN$), indium zinc oxide (IZO, $In_xZn_yO$), gallium zinc oxide (GZO, $Ga_xZn_yO$), tin zinc oxide (TZO, $Sn_xZn_yO$) and/or tin gallium oxide (TGO, $Sn_xGa_yO$).

In some embodiments, the first preliminary oxide semiconductor layer 12a may include a non-crystalline oxide semiconductor material. For example, the first preliminary oxide semiconductor layer 12a may include an amorphous GZO.

In some other embodiments, the first preliminary oxide semiconductor layer 12a may include a crystalline oxide semiconductor material. For example, the first preliminary oxide semiconductor layer 12a may include a polycrystalline GZO and/or a spinel GZO.

Figure 25:
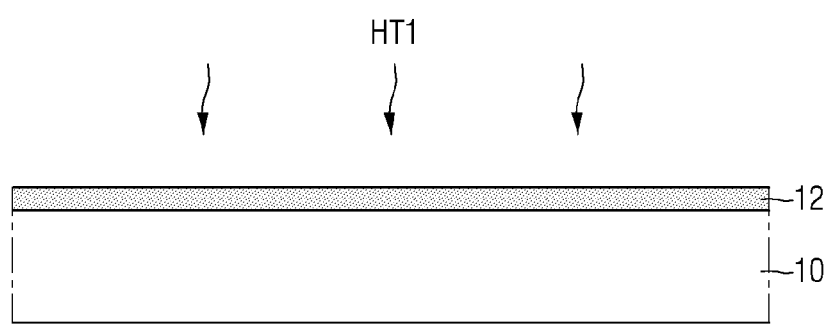

Referring to FIG. 25, a first post-treatment process HT1 is performed to form a first oxide semiconductor layer 12.

The first post-treatment process HT1 may include, for example, an annealing process. In some embodiments, the first post-treatment process HT1 may be performed at a temperature of about 700° C. or less. For example, the first post-treatment process HT1 may include an annealing process performed at a temperature of about 200° C. to about 700° C.

As the first post-treatment process HT1 is performed, the first preliminary oxide semiconductor layer 12a may be crystallized to form the first oxide semiconductor layer 12 having crystallinity. For example, the first oxide semiconductor layer 12 may include a polycrystalline GZO and/or a spinel GZO.

In some embodiments, the first post-treatment process HT1 may be omitted. For example, when the first preliminary oxide semiconductor layer 12a includes a crystalline oxide semiconductor material, the first post-treatment process HT1 may be omitted.

Figure 26:
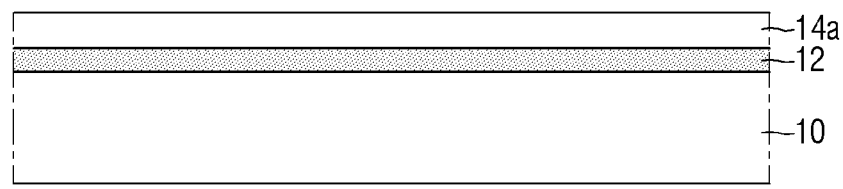

Referring to FIG. 26, a second preliminary oxide semiconductor layer 14a is formed on the first oxide semiconductor layer 12.

The second preliminary oxide semiconductor layer 14a may be formed by, for example, a deposition process. The second preliminary oxide semiconductor layer 14a may include a quaternary oxide semiconductor material containing first and second metal elements and a third metal element different from the first and second metal elements. For example, the quaternary oxide semiconductor material may be, but not limited to, indium gallium zinc oxide (IGZO, $In_xGa_yZn_zO$), indium gallium silicon oxide (IGSO, $In_xGa_ySi_zO$), indium tin zinc oxide (ITZO, $In_xSn_yZn_zO$), indium tin gallium oxide (ITGO, $In_xSn_yGa_zO$), zirconium zinc tin oxide (ZZTO, $Zr_xZn_ySn_zO$), hafnium indium zinc oxide (HIZO, $Hf_xIn_yZn_zO$), gallium zinc tin oxide (GZTO, $Ga_xZn_ySn_zO$), aluminum zinc tin oxide (AZTO, $Al_xZn_ySn_zO$) and/or ytterbium gallium zinc oxide (YGZO, $Yb_xGa_yZn_zO$).

The second preliminary oxide semiconductor layer 14a may include a non-crystalline oxide semiconductor material. For example, the second preliminary oxide semiconductor layer 14a may include an amorphous IGZO.

Figure 27:
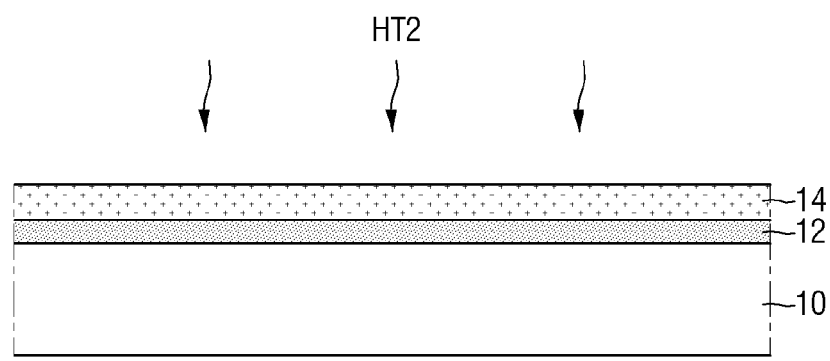

Referring to FIG. 27, a second post-treatment process HT2 is performed to form a second oxide semiconductor layer 14.

The second post-treatment process HT2 may include, for example, an annealing process. In some embodiments, the second post-treatment process HT2 may be performed at a temperature of about 700° C. or less. For example, the second post-treatment process HT2 may include an annealing process performed at a temperature of about 200° C. to about 700° C.

As the second post-treatment process HT2 is performed, the second preliminary oxide semiconductor layer 14a may be crystallized to form a second oxide semiconductor layer 14 having crystallinity. For example, the second oxide semiconductor layer 14 may include polycrystalline IGZO, spinel IGZO, and/or c-axis aligned crystalline (CAAC) IGZO.

Subsequently, referring to FIG. 1, a source/drain area 16, a gate structure 20, an interlayer insulating layer 30, and a source/drain contact 35 are formed on the first substrate 10, the first oxide semiconductor layer 12, and the second oxide semiconductor layer 14.

For example, a first gate dielectric layer 22, a first gate electrode 24, and a first gate capping pattern 26 may be formed on the first oxide semiconductor layer 12 and the second oxide semiconductor layer 14. Subsequently, an etching process using the first gate capping pattern 26 as an etching mask may be performed. As a result, the first oxide semiconductor layer 12 and the second oxide semiconductor layer 14, which are patterned, may be formed. Then, the source/drain area 16, a gate spacer 28, the interlayer insulating layer 30, and the source/drain contact 35 may be formed. As a result, the semiconductor device described above with reference to FIG. 1 may be fabricated.

In the method for fabricating a semiconductor device according to some embodiments, the second oxide semiconductor layer 14 may be formed on the first oxide semiconductor layer 12 to have a high degree of crystallinity. In detail, as described above, the first oxide semiconductor layer 12 containing the first metal element (or first and second metal elements) may serve as a seed layer in a process of depositing the second oxide semiconductor layer 14 containing the first to third metal elements to improve crystallinity of the second oxide semiconductor layer 14. Therefore, a method for fabricating a semiconductor device with improved performance and reliability may be provided.

Figure 28:
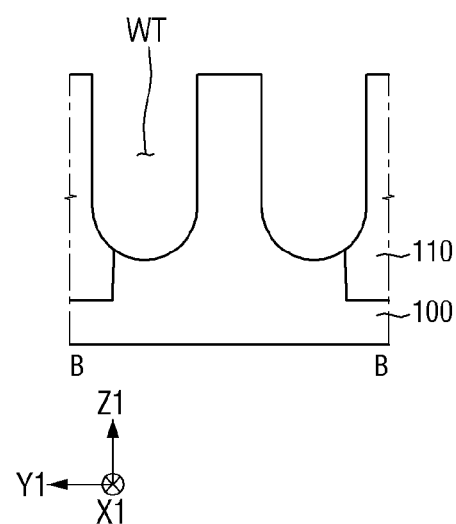
FIGS. 28 to 30 are views illustrating intermediate operations of a method for fabricating a semiconductor device according to some embodiments.
Figure 29:
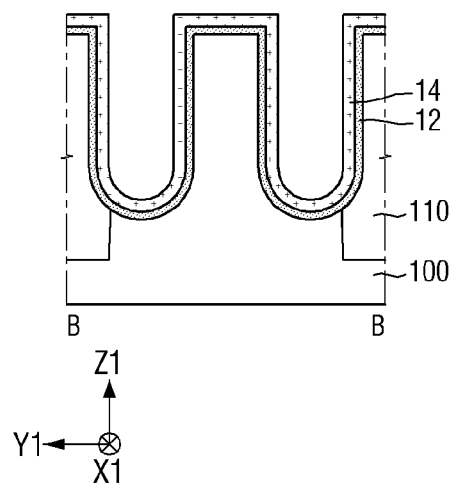
Figure 30:
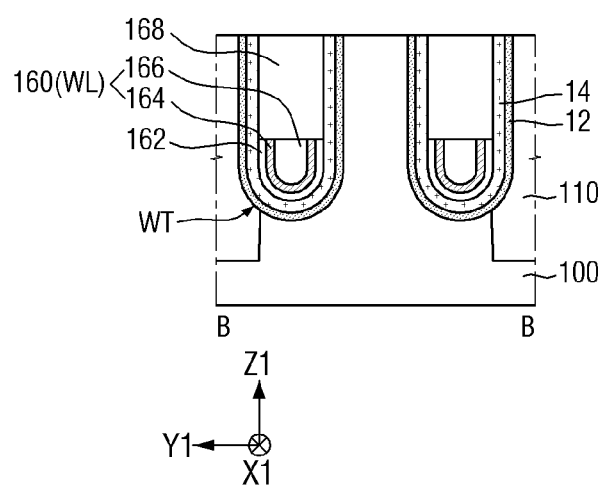

FIGS. 28 to 30 are views illustrating intermediate operations of a method for fabricating a semiconductor device according to some embodiments. For convenience of description, portions duplicated with those described with reference to FIGS. 1 to 5 and 24 to 27 will be described briefly or omitted.

Referring to FIG. 28, a gate trench WT is formed in a second substrate 100.

The gate trench WT may extend in the second direction X1. In some embodiments, the gate trench WT may be formed in the second substrate 100 and an element isolation layer 110.

Referring to FIG. 29, a first oxide semiconductor layer 12 and a second oxide semiconductor layer 14 are formed in the gate trench WT.

The first oxide semiconductor layer 12 and the second oxide semiconductor layer 14 may be sequentially deposited in the gate trench WT. Each of the first oxide semiconductor layer 12 and the second oxide semiconductor layer 14 may extend to be conformal along a profile of the gate trench WT. Because the first oxide semiconductor layer 12 and the second oxide semiconductor layer 14 are formed to be similar to those described above with reference to FIGS. 24 to 27, their detailed description will be omitted.

Referring to FIG. 30, a second gate dielectric layer 162 and a second gate electrode 160 are formed in the gate trench WT.

The second gate dielectric layer 162 and the second gate electrode 160 may be sequentially deposited on the second oxide semiconductor layer 14. Each of the second gate dielectric layer 162 and the second gate electrode 160 may extend to be conformal along a profile of the second oxide semiconductor layer 14.

In some embodiments, the second gate dielectric layer 162 and the second gate electrode 160 may at least partially fill a portion of the gate trench WT on the second oxide semiconductor layer 14. The second gate capping pattern 168 may at least partially fill another portion of the gate trench WT on the second oxide semiconductor layer 14. In this case, an upper surface of the second gate electrode 160 may be lower than that of the second substrate 100.

After the second gate dielectric layer 162, the second gate electrode 160 and the second gate capping pattern 168 are formed, a planarization process for exposing the upper surface of the second substrate 100 may be performed.

Subsequently, referring to FIGS. 3 to 5, a base insulating layer 120, a first conductive line 130 (BL), a direct contact DC, a spacer structure 140, contact structures BC and LP, and a first capacitor structure 190 are formed on the second substrate 100 and the element isolation layer 110. Therefore, the semiconductor memory device including a buried channel transistor (BCAT) described with reference to FIGS. 3 to 5 may be fabricated.

Figure 31:
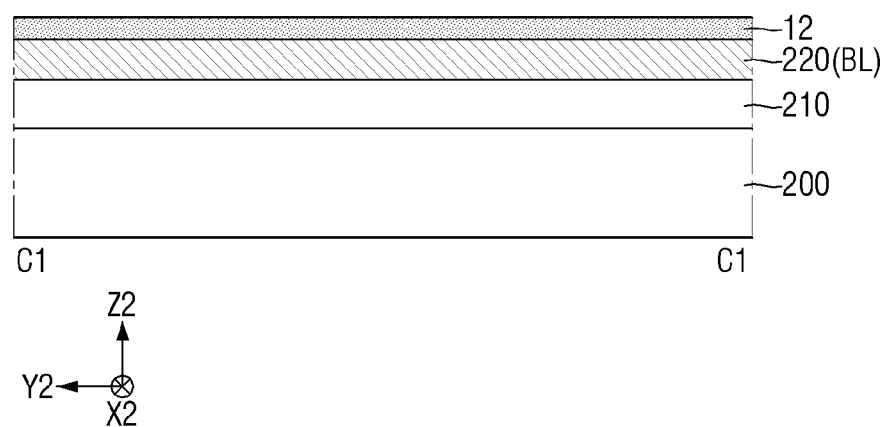
FIGS. 31 to 33 are views illustrating intermediate operations of a method for fabricating a semiconductor device according to some embodiments.
Figure 32:
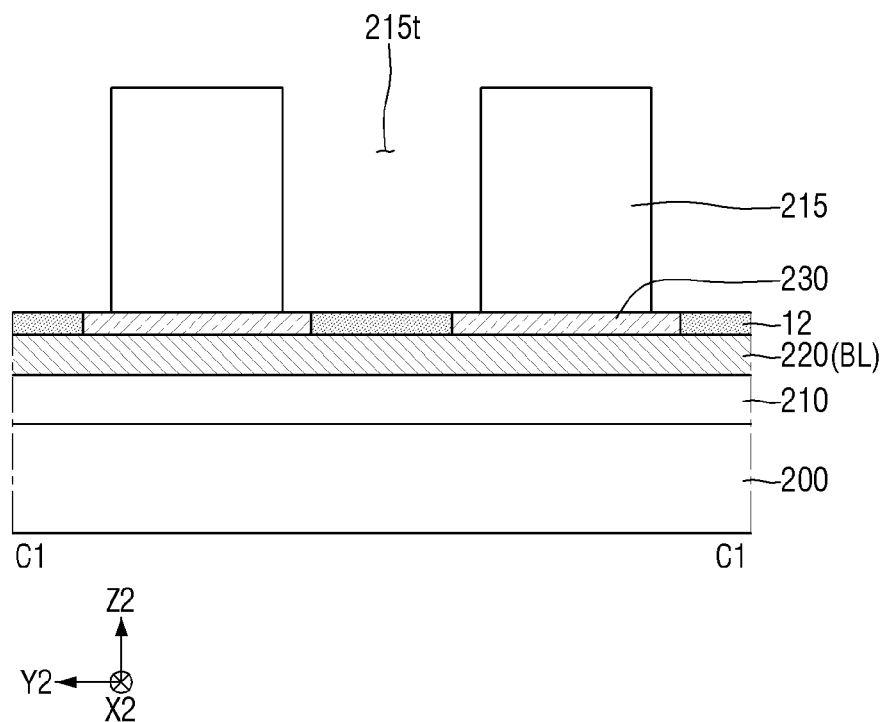
Figure 33:
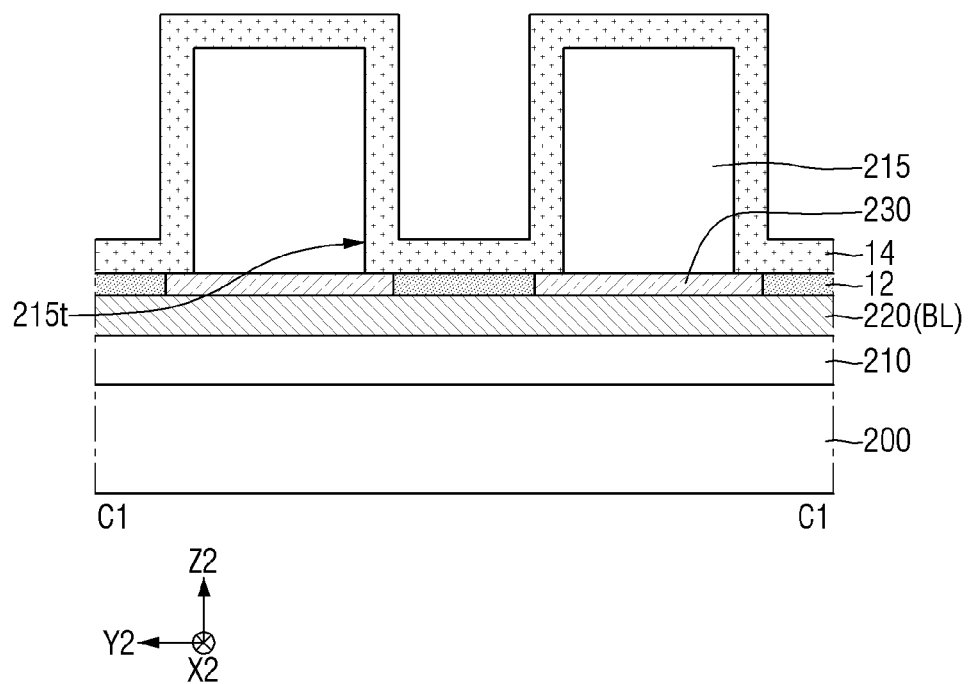

FIGS. 31 to 33 are views illustrating intermediate operations of a method for fabricating a semiconductor device according to some embodiments. For convenience of description, portions duplicated with those described with reference to FIGS. 1, 2 and 6 to 27 will be described briefly or omitted.

Referring to FIG. 31, a first lower insulating layer 210, a second conductive line 220, and a first oxide semiconductor layer 12 are formed on a third substrate 200.

The first lower insulating layer 210 may be formed on the third substrate 200. The second conductive line 220 may be formed on the first lower insulating layer 210. The plurality of second conductive lines 220 may extend in the fourth direction Y2, and may be spaced from each other at generally constant intervals in the fifth direction X2 crossing the fourth direction Y2. The first lower insulating layer 210 may be formed to at least partially fill a space between the second conductive lines 220.

The first oxide semiconductor layer 12 may be formed on the first lower insulating layer 210 and the second conductive line 220. Because the first oxide semiconductor layer 12 is formed to be similar to that described above with reference to FIGS. 24 and 25, its detailed description will be omitted.

Referring to FIG. 32, a lower contact layer 230 and an isolation insulating layer 215 are formed.

For example, an etching process for patterning the first oxide semiconductor layer 12 may be performed. Subsequently, the lower contact layer 230 for at least partially filling a space between the patterned first oxide semiconductor layers 12 may be formed. The lower contact layer 230 may be connected to the second conductive line 220.

Subsequently, the isolation insulating layer 215 may be formed on the lower contact layer 230 and the first oxide semiconductor layer 12. The isolation insulating layer 215 may include a channel trench 215t that longitudinally extends in the fifth direction X2. The channel trench 215t may expose at least a portion of the lower contact layer 230 and at least a portion of the first oxide semiconductor layer 12. For example, the channel trench 215t may expose an upper surface of the lower contact layer 230 and an upper surface of the first oxide semiconductor layer 12.

Referring to FIG. 33, a second oxide semiconductor layer 14 is formed in the channel trench 215t.

The second oxide semiconductor layer 14 may extend to be conformal along a profile of the channel trench 215t. As a result, the second oxide semiconductor layer 14, which is in physical contact with the lower contact layer 230 and the first oxide semiconductor layer 12 may be formed. Because the second oxide semiconductor layer 14 is formed to be similar to that described above with reference to FIGS. 26 and 27, its detailed description will be omitted.

Subsequently, referring to FIGS. 6 to 8, the third gate dielectric layer 240, the gate line 250 (WL), the upper contact layer 270, and the second capacitor structure 290 are formed on the second oxide semiconductor layer 14. Therefore, a semiconductor memory device including a vertical channel transistor (VCT) described with reference to FIGS. 6 to 8 may be fabricated.

While the inventive concept has been particularly shown and described with reference to embodiments thereof, it will be understood that various changes in form and details may be made therein without departing from the spirit and scope of the following claims.

What is claimed is:

1. A semiconductor device comprising:
a conductive line that extends in a first direction on a substrate;
a first oxide semiconductor layer, which includes a first crystalline oxide semiconductor material containing a first metal element, on the conductive line;
a second oxide semiconductor layer, which is in physical contact with the first oxide semiconductor layer and is connected to the conductive line, on the conductive line;
a gate electrode that extends in a second direction, which crosses the first direction, on a side of the second oxide semiconductor layer; and
a capacitor structure that is connected to the second oxide semiconductor layer and is on the second oxide semiconductor layer and the gate electrode,
wherein the second oxide semiconductor layer includes a second crystalline oxide semiconductor material containing the first metal element and second and third metal elements, which are different from the first metal element.

2. The semiconductor device of claim 1, further comprising a lower contact layer, which connects the conductive line to the second oxide semiconductor layer, on the conductive line.

3. The semiconductor device of claim 2, wherein the first oxide semiconductor layer is on a first portion of an upper surface of the conductive line,
wherein the lower contact layer is on a second portion of the upper surface of the conductive line, and
wherein the second oxide semiconductor layer is in physical contact with an upper surface of the first oxide semiconductor layer and an upper surface of the lower contact layer.

4. The semiconductor device of claim 2, wherein the first oxide semiconductor layer extends along at least a portion of an upper surface of the lower contact layer, and
wherein the second oxide semiconductor layer is in physical contact with a side of the first oxide semiconductor layer and the upper surface of the lower contact layer.

5. The semiconductor device of claim 1, further comprising an upper contact layer, which connects the second oxide semiconductor layer to the capacitor structure, on the second oxide semiconductor layer.

6. The semiconductor device of claim 1, further comprising a lower oxide layer on a side of the conductive line and on the substrate,
wherein the second oxide semiconductor layer is in physical contact with an upper surface of the lower oxide layer.

7. The semiconductor device of claim 1, wherein the first oxide semiconductor layer extends in the second direction and is in physical contact with a plurality of second oxide semiconductor layers arranged along the second direction.

8. The semiconductor device of claim 1, wherein the first oxide semiconductor layer extends in the first direction and is in physical contact with a plurality of second oxide semiconductor layers arranged along the first direction.

9. The semiconductor device of claim 1, wherein the first crystalline oxide semiconductor material is a binary or ternary oxide semiconductor material containing the first metal element, and
wherein the second crystalline oxide semiconductor material is a quaternary oxide semiconductor material containing the first, second, and third metal elements.

10. A semiconductor device comprising:
a substrate;
a first oxide semiconductor layer, including a first crystalline oxide semiconductor material containing a first metal element, on the substrate;
a second oxide semiconductor layer, including a second crystalline oxide semiconductor material containing the first metal element, a second metal element, and a third metal element, wherein the second metal element and the third metal element are different from the first metal element, on the first oxide semiconductor layer; and
a conductive line connected to the second oxide semiconductor layer,
wherein the first crystalline oxide semiconductor material contains the third metal element, and
wherein a concentration reduction rate of the third metal element in the first oxide semiconductor layer is greater than a concentration reduction rate of the first metal element in the first oxide semiconductor layer in a direction away from the second oxide semiconductor layer.

11. The semiconductor device of claim 10, wherein the first crystalline oxide semiconductor material is a binary or ternary oxide semiconductor material containing the first metal element, and
wherein the second crystalline oxide semiconductor material is a quaternary oxide semiconductor material containing the first, second, and third metal elements.

12. The semiconductor device of claim 10, wherein the first crystalline oxide semiconductor material further contains the second metal element, and
wherein a concentration reduction rate of the third metal element in the first oxide semiconductor layer is greater than a concentration reduction rate of the second metal element in the first oxide semiconductor layer in the direction away from the second oxide semiconductor layer.

13. The semiconductor device of claim 10, wherein a thickness of the second oxide semiconductor layer is greater than a thickness of the first oxide semiconductor layer.

* * * * *